(12) United States Patent
Takesako et al.

(10) Patent No.: US 10,714,482 B1
(45) Date of Patent: Jul. 14, 2020

(54) METHOD OF FABRICATING DYNAMIC RANDOM ACCESS MEMORY

(71) Applicant: Winbond Electronics Corp., Taichung (TW)

(72) Inventors: Kazuaki Takesako, Kanagawa (JP); Kazutaka Manabe, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/813,740

(22) Filed: Mar. 10, 2020

Related U.S. Application Data

(62) Division of application No. 15/666,571, filed on Aug. 2, 2017, now Pat. No. 10,636,796.

(51) Int. Cl.

| | |
|---|---|
| H01L 21/00 | (2006.01) |
| H01L 27/108 | (2006.01) |
| H01L 29/78 | (2006.01) |
| H01L 29/417 | (2006.01) |
| H01L 29/66 | (2006.01) |
| H01L 27/12 | (2006.01) |
| H01L 21/762 | (2006.01) |
| H01L 21/8234 | (2006.01) |
| H01L 21/84 | (2006.01) |
| H01L 21/8238 | (2006.01) |

(52) U.S. Cl.
CPC .. *H01L 27/10823* (2013.01); *H01L 21/76224* (2013.01); *H01L 21/823431* (2013.01); *H01L 21/823821* (2013.01); *H01L 21/845* (2013.01); *H01L 27/10826* (2013.01); *H01L 27/10876* (2013.01); *H01L 27/10879* (2013.01); *H01L 27/10891* (2013.01); *H01L 27/1211* (2013.01); *H01L 29/41791* (2013.01); *H01L 29/66795* (2013.01); *H01L 29/785* (2013.01); *H01L 29/7856* (2013.01)

(58) Field of Classification Search
CPC ............. H01L 27/10894; H01L 27/108; H01L 27/10826; H01L 27/10823; H01L 27/10891
See application file for complete search history.

(56) References Cited

U.S. PATENT DOCUMENTS

| | | | |
|---|---|---|---|
| 8,742,494 B2 * | 6/2014 | Wu | H01L 29/4236 257/296 |
| 2011/0079836 A1 * | 4/2011 | Lin | H01L 27/10826 257/306 |

* cited by examiner

*Primary Examiner* — Nicholas J Tobergte
(74) *Attorney, Agent, or Firm* — JCIPRNET

(57) ABSTRACT

A dynamic random access memory and a method of fabricating the same are provided. The dynamic random access memory includes forming a gate trench in a substrate. An isolation structure is formed in the substrate and defines a plurality of active regions arranged in a column in a first direction. A buried word line structure is formed to fill the gate trench and extend along the first direction and across the plurality of active regions and the isolation structure. A plurality of first fin structures is formed in an intersecting region of the plurality of active regions and the buried word line structure, arranged in a column along the first direction, and surrounded and covered by the buried word line structure. A dielectric layer is formed on the substrate to fill the gate trench and cover the buried word line structure.

20 Claims, 49 Drawing Sheets

METHOD OF FABRICATING DYNAMIC RANDOM ACCESS MEMORY

CROSS-REFERENCE TO RELATED APPLICATION

This application is a divisional application of and claims the priority benefit of a prior application Ser. No. 15/666,571, filed on Aug. 2, 2017, now allowed. The entirety of the above-mentioned patent application is hereby incorporated by reference herein and made a part of this specification.

BACKGROUND OF THE INVENTION

Field of the Invention

The invention relates to a dynamic random access memory and a method of fabricating the same.

Description of Related Art

The performance of the dynamic random access memory directly affects the yield and relevant specifications thereof, such as write recovery time (tWR) and refresh performance. However, as the design size of the dynamic random access memory becomes smaller, the semiconductor apparatus is constantly developed to have higher density, and the performance of the dynamic random access memory is reduced as a result. Therefore, how to maintain or improve the performance of the dynamic random access memory is an important issue in the art.

SUMMARY OF THE INVENTION

The embodiment of the invention provides a meth of a dynamic random access memory having fin structures and buried gate structures that can improve the performance of the dynamic random access memory.

The embodiment of the invention provides a method of fabricating of a dynamic random access memory including forming a gate trench in a substrate. An isolation structure is formed in the substrate and defines a plurality of active regions arranged in a column along a first direction in the substrate. A buried word line structure is formed to fill the gate trench and extend along the first direction and across the plurality of active regions and the isolation structure. A plurality of first fin structures is formed in an intersecting region of the active regions and the buried word line structure, arranged in a column along the first direction, and surrounded and covered by the buried word line structure. A dielectric layer is formed on the substrate to fill the gate trench and cover the buried word line structure.

The invention provides a method of fabricating of a dynamic random access memory including forming a first word line tunnel in a substrate. A first buried gate structure is formed in the substrate above and separated from the first word line tunnel, the sidewall and bottom surface thereof are covered by the substrate, and the top surface thereof is covered by the dielectric layer. A dielectric material layer is formed and at least covers the surface of the first word line tunnel.

The invention provides a method of fabricating a dynamic random access memory including removing a portion of a substrate such that the substrate includes a convex portion and a concave portion. A first convex portion of the convex portion is protected and a second convex portion below the first convex portion is removed to form a first word line tunnel in the substrate. A portion of the first convex portion is removed to form a gate trench and a first fin structure. A first buried gate structure including a gate dielectric layer and a conductive layer is formed in the gate trench.

Based on the above, the dynamic random access memory of the invention has fin structures and buried gate structures or insulation structures. Since the fin structures are surrounded by the buried word line structure, switching performance can be improved and the threshold value thereof can be reduced, such that refresh performance can be improved. In some embodiments, the buried gate structure is surrounded by the substrate, such that channel resistance can be reduced and the performance of the dynamic random access memory of the invention in terms of write recovery time can be improved. In some other embodiments, the fin structures and the substrate are separated by the insulation structures such that the fin structures can produce lower depletion layer capacitance to effectively improve device performance.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
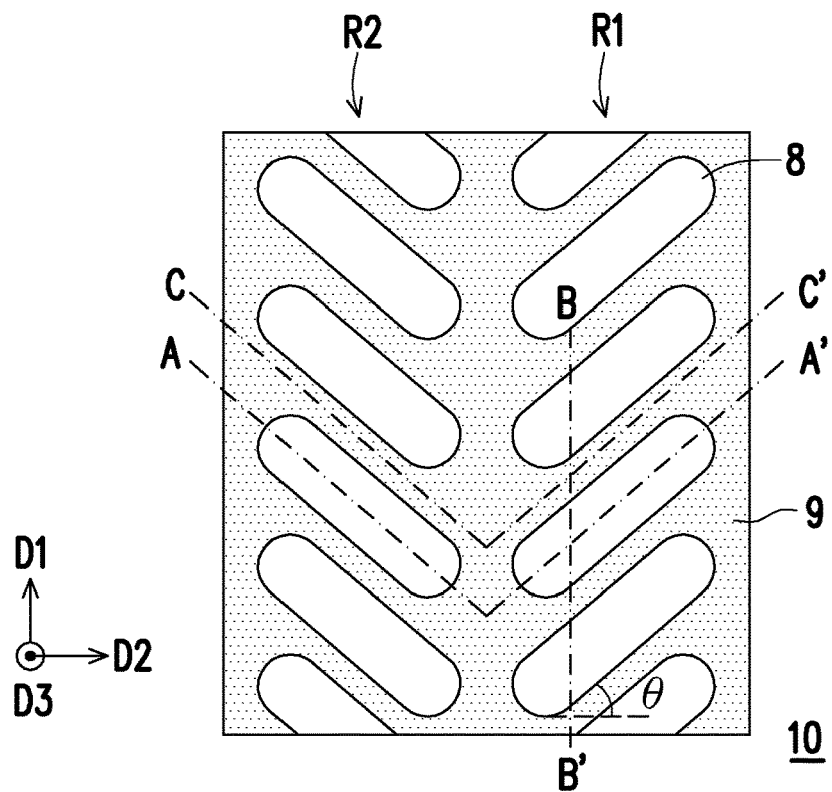
FIG. 1 to FIG. 3 are top views of the fabrication method process of a dynamic random access memory according to the invention.

In different embodiments below, the same reference numerals represent the same devices, and for simplicity, the materials and forming methods . . . etc. thereof are not repeated. Figures with the same letters but different numbers (such as FIG. 4A to FIG. 6A) represent cross-sectional schematic diagrams along different line segments in the same step, and in the top view plane of FIG. 1 to FIG. 3, the column direction is a first direction D1, the row direction is a second direction D2, and the direction perpendicular to the top view plane is a D3 direction, but are not limited thereto.

Figure 2:
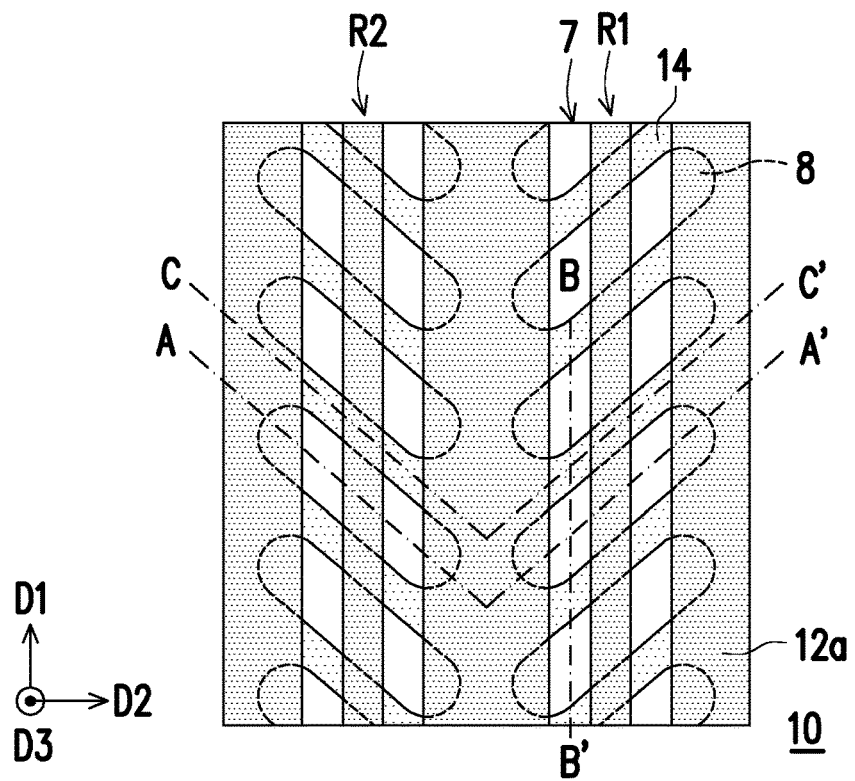
Figure 3:
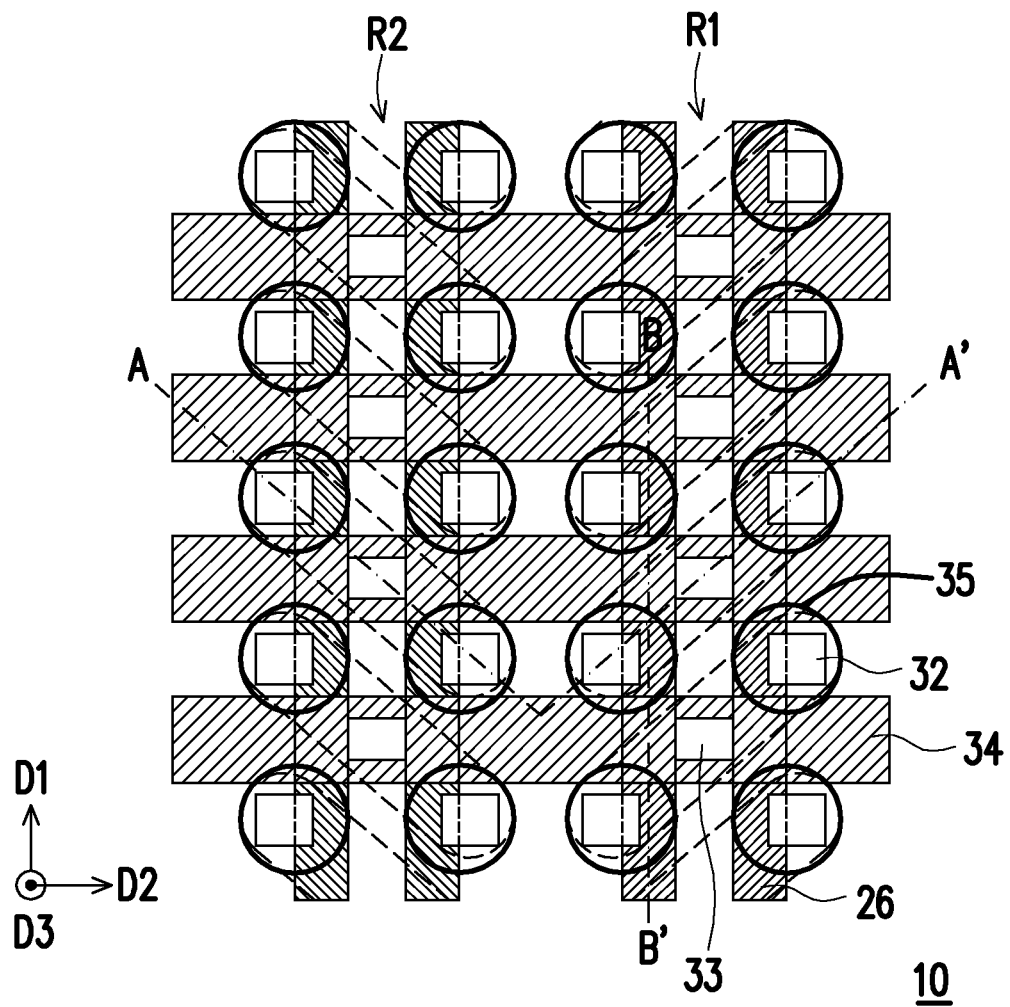
Figure 5A:
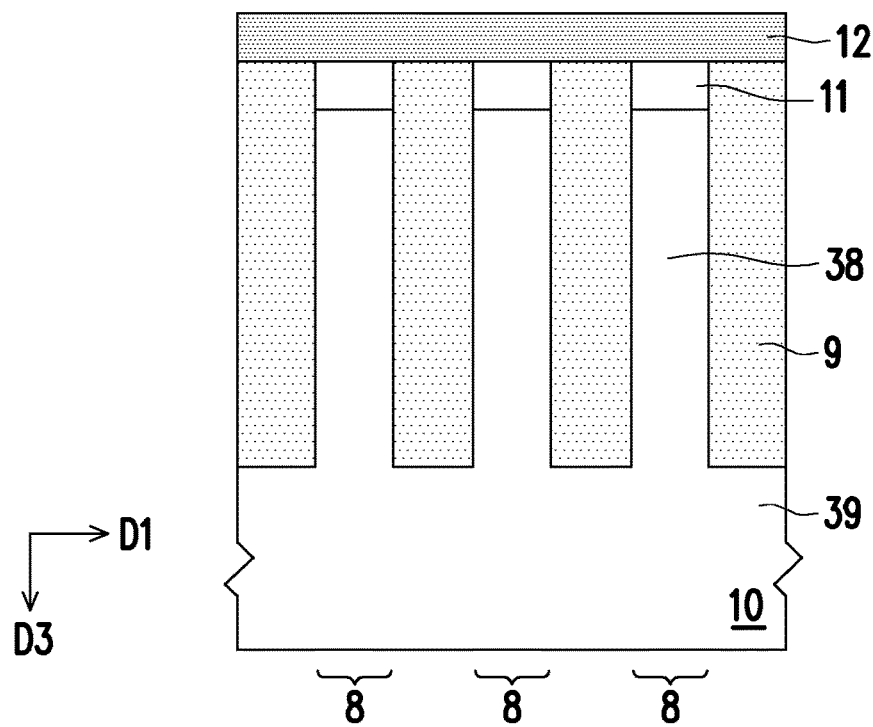
FIG. 5A to FIG. 5J are cross-sectional schematic diagrams of the fabrication method process of the dynamic random access memory of the B-B' line segment in FIG. 1 to FIG. 3 according to the first embodiment of the invention.
Figure 6A:
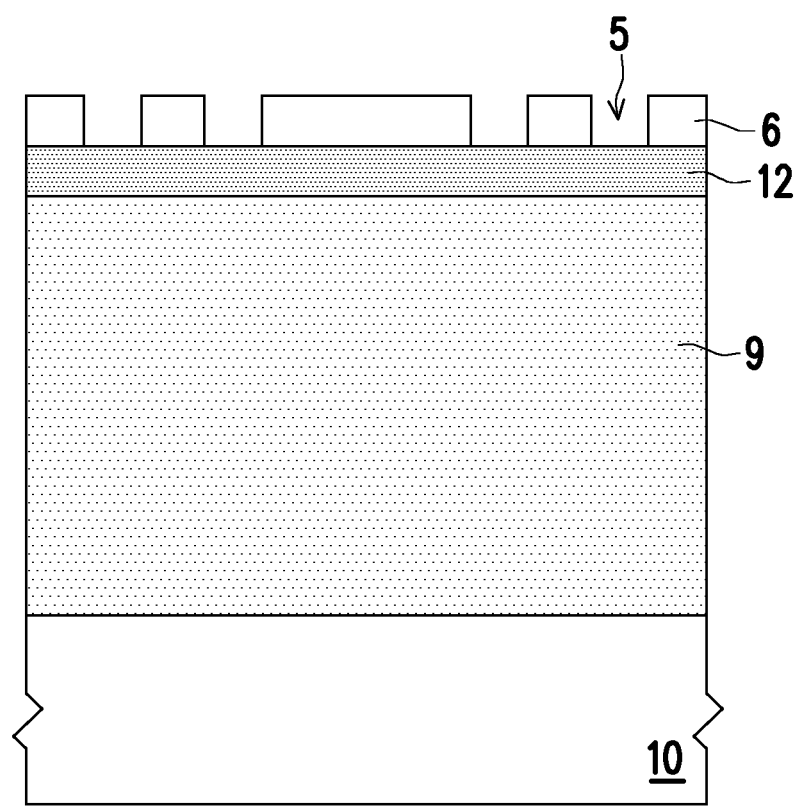
FIG. 6A to FIG. 6I are cross-sectional schematic diagrams of the fabrication method process of the dynamic random access memory of the C-C' line segment in FIG. 1 to FIG. 3 according to the first embodiment of the invention.
Figure 5B:
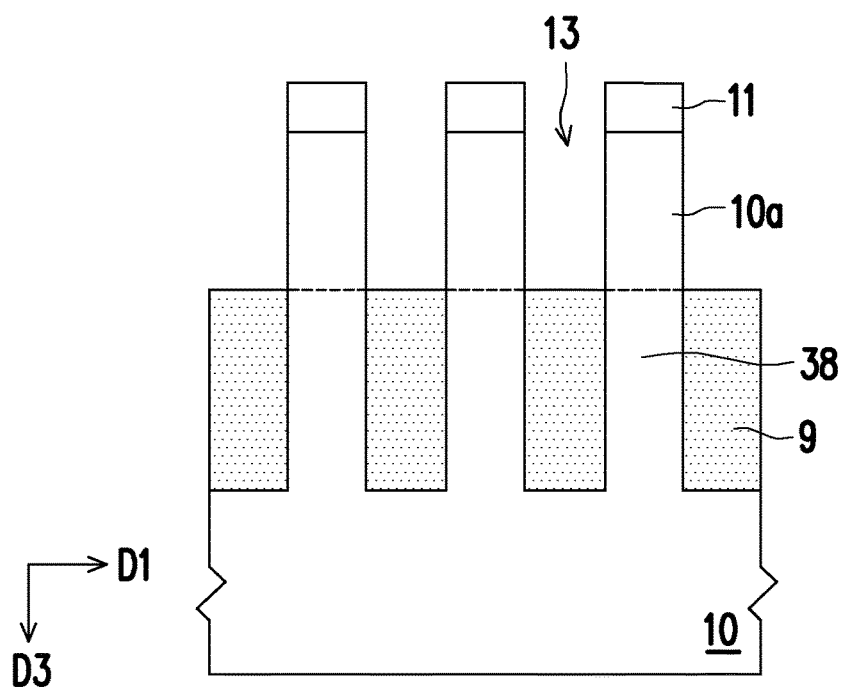
Figure 6B:
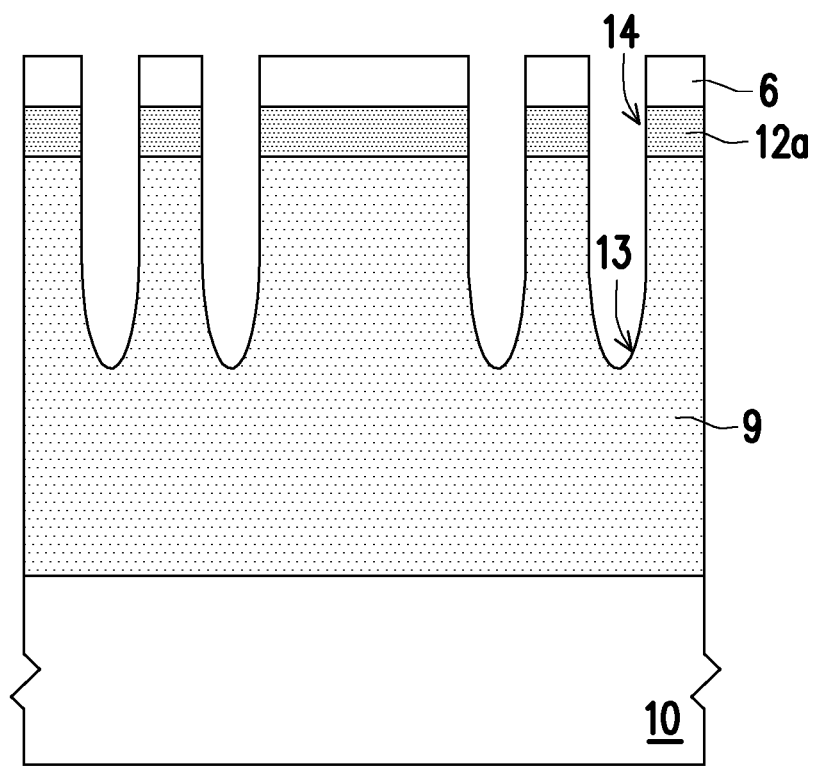
Figure 5C:
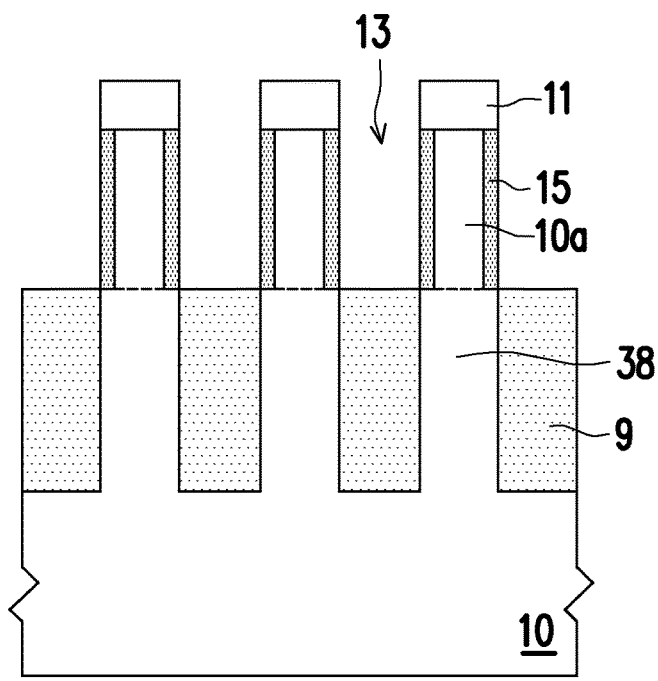
Figure 6C:
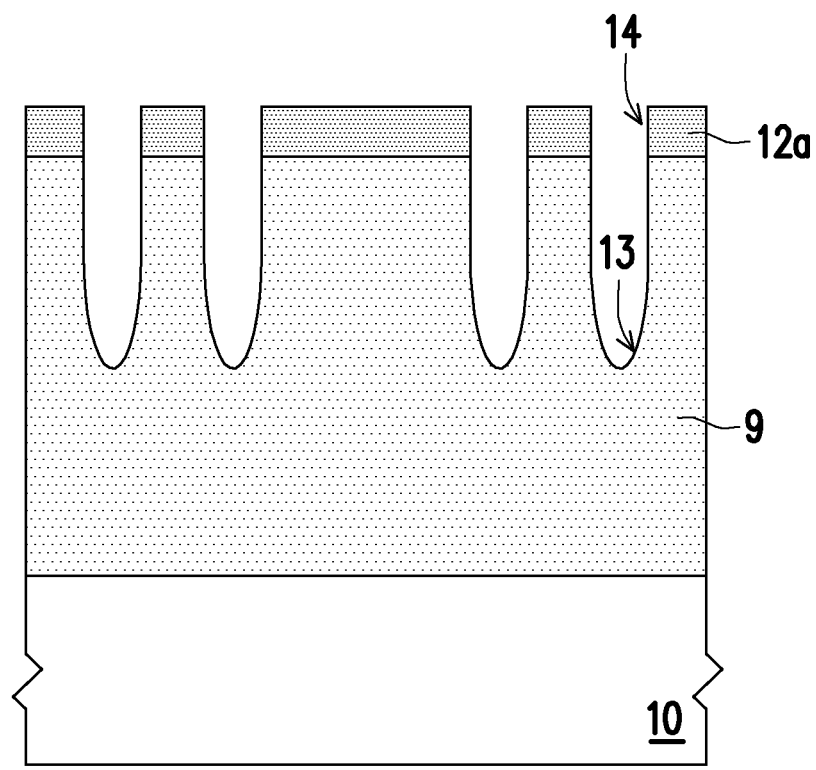
Figure 5D:
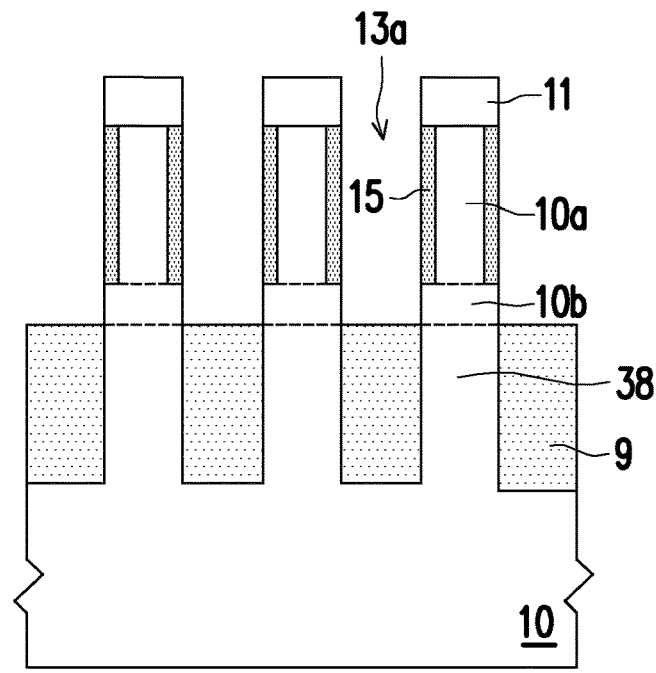
Figure 6D:
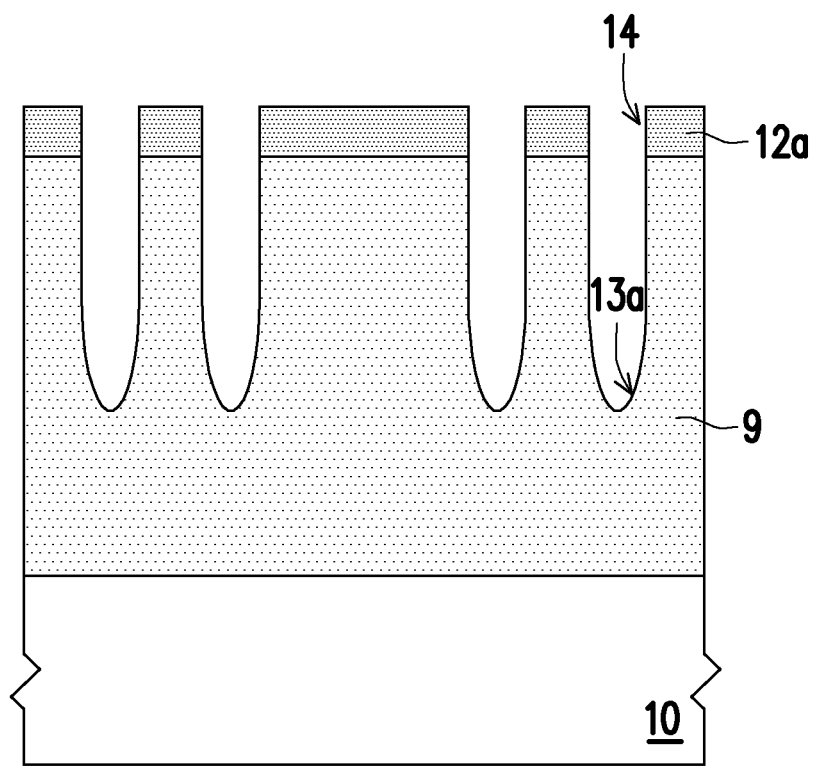

FIG. 1 to FIG. 3 are top views of the fabrication method process of a dynamic random access memory according to the invention. FIG. 4A to FIG. 4J, FIG. 5A to FIG. 5J, and FIG. 6A to FIG. 6I are respectively cross-sectional schematic diagrams of the fabrication method process of the dynamic random access memory according to the first embodiment of the invention at A-A', B-B', and C-C' line segments.

Referring to FIG. 1 and FIGS. 4A to 6A, a substrate 10 is provided. The substrate 10 is, for instance, a semiconductor substrate, a semiconductor compound, or a semiconductor alloy. For instance, the semiconductor substrate can include a silicon substrate. The silicon substrate can be an undoped silicon substrate or a doped silicon substrate. The doped silicon substrate can be an N-type doped silicon substrate or a P-type doped silicon substrate.

Referring to FIG. 1 and FIG. 4A to FIG. 6A, a mask layer 11 is formed on the substrate 10. For clarity, FIG. 1 only shows an isolation structure 9 and active regions 8. The material of the mask layer 11 includes an insulation material, and the insulation material is, for instance, silicon nitride. The forming method of the mask layer 11 is, for instance, a chemical vapor deposition method, a physical vapor deposition method, a spin coating method or a combination thereof. Next, the isolation structure 9 is formed in the substrate 10 to define the active regions 8. The material of the isolation structure 9 includes an insulation material, and the insulation material is, for instance, silicon oxide. The method of forming the isolation structure 9 is, for instance, a shallow trench isolation (STI) method. When the isolation structure 9 is formed, a plurality of concave portions 39 is first formed in the substrate 10 using the mask layer 11 as a mask via a lithography and etching method. The substrate 10 adjacent to the concave portions 39 is a convex portion 38. In other words, the substrate 10 has concave portions 39 and convex portions 38. In a first direction D1, the concave portions 39 and the convex portions 38 are alternated with each other. The isolation structure 9 is filled in the concave portions 39 and the convex portions 38 are located in the active regions 8. The active regions 8 are covered by the mask layer 11. In some embodiments, the surface of the isolation structure 9 is protruded beyond the surface of the substrate 10 and is level with the surface of the mask layer 11.

Referring to FIG. 1, in some embodiments, the active regions 8 of the substrate 10 are strips and arranged in an array. Two adjacent columns of the active regions 8 may disposed as mirror images of each other. For instance, R1 and R2 in FIG. 1 are two active region columns R1 and R2 of the substrate 10. In the active region column R1, the length direction of the active regions 8 and the second direction D2 are non-orthogonal and form an angle θ. In the active region column R2, the length direction of the active regions 8 and the second direction D2 are non-orthogonal and form an angle (180°-θ). However, the invention is not limited thereto, and two adjacent active region columns R1 and R2 can also be disposed as non-mirror images.

Referring to FIG. 4A to FIG. 6A, next, a hard mask layer 12 is formed on the substrate 10. The hard mask layer 12 covers the mask layer 11 and the isolation structure 9. The material of the hard mask layer 12 is different from the material of the mask layer 11. The material of the hard mask layer 12 includes an insulation material, and the insulation material is, for instance, silicon oxide, silicon nitride, or a combination thereof. The method of forming the hard mask layer 12 is, for instance, a chemical vapor deposition method, a physical vapor deposition method, or a spin coating method. Next, a patterned mask layer 6 is formed on the substrate 10. The patterned mask layer 6 is, for instance, a patterned photoresist layer. The patterned mask layer 6 has an opening 5. The opening 5 exposes a word line region 7 which is extended along the first direction D1 on the substrate 10 (FIG. 1).

Referring to FIG. 2, FIG. 4A to FIG. 6A, and FIG. 4B to FIG. 6B, the hard mask layer 12 in the word line region 7 exposed by the opening 5 is removed using the patterned mask layer 6 as a mask to form a patterned hard mask layer 12a. The removal method is, for instance, etching, such as anisotropic etching. The patterned hard mask layer 12a has an opening 14. The opening 14 exposes the mask layer 11 and the isolation structure 9 in the word line region 7. Next, the mask layer 11 and a portion of the isolation structure 9 in the word line region 7 are removed using the patterned mask layer 6 and the patterned hard mask layer 12a as a mask to form a trench 13 in the isolation structure 9 and expose a first convex portion 10a of the convex portion 38. The removal method can be etching such as anisotropic etching.

Referring to FIG. 2, FIG. 4C to FIG. 6C, and FIG. 4E to FIG. 6E, the patterned mask layer 6 is removed. The patterned mask layer 6 can be removed by ashing, wet removal, or a combination thereof. After the patterned mask layer 6 is removed, the patterned hard mask layer 12a is exposed. The opening 14 of the patterned hard mask layer 12a exposes the isolation structures 9 and the active regions 8 alternately arranged in the word line region 7.

Referring to FIG. 2, FIG. 4C to FIG. 6C, and FIG. 4E to FIG. 6E, the first convex portion 10a of the convex portion 38 is protected and a portion of the convex portion 38 below the first convex portion 10a (a second convex portion 10b) is removed to form a first word line tunnel 16 in the substrate 10. This step is described in detail as follows.

Referring to FIG. 2 and FIG. 4C to FIG. 6C, a liner 15 is formed on the sidewall of the first convex portion 10a. The material of the liner 15 includes an insulation material. The insulation material is, for instance, silicon oxide, and the forming method is, for instance, a thermal oxidation method. In an embodiment in which a portion of the mask layer 11 is silicon nitride, in this process, the mask layer 11 may also be oxidized such that a thin oxide layer (not shown) is formed on the sidewall thereof.

Referring to FIG. 13 and FIG. 4D to FIG. 6D, a portion of the isolation structure 9 below the trench 13 is removed using the patterned hard mask layer 12a and the mask layer 11 as a mask via, for instance, an etching process to form a trench 13a deeper than the trench 13 in the isolation structure 9 and expose the second convex portion 10b of the convex portion 38 in the substrate 10. The second convex portion 10b is located below the first convex portion 10a, and the sidewall of the second convex portion 10b is not covered by the liner and is exposed (FIG. 5D). Next, a cleaning process is performed to clean and remove a thin oxide layer that may be formed on the sidewall of the mask layer 11. However, in the cleaning process, a very small portion of the liner 15 may be removed, but a sufficient thickness of the liner 15 is kept. The cleaning method is, for instance, wet etching.

Referring to FIG. 2 and FIG. 4E to FIG. 6E, the second convex portion 10b is removed using the mask layer 11 and the liner 15 as a protective layer to form the word line tunnel 16 between the first convex portion 10a and the substrate 10. The removal method is, for instance, etching, and the etching includes dry etching, wet etching, or a combination thereof.

Figure 4A:
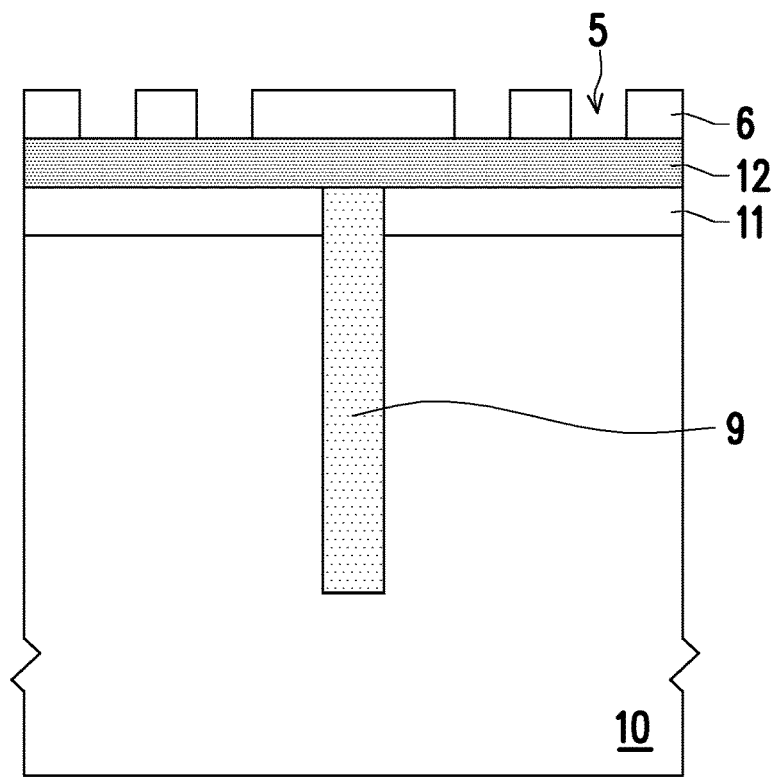
FIG. 4A to FIG. 4J are cross-sectional schematic diagrams of the fabrication method process of the dynamic random access memory of the A-A' line segment in FIG. 1 to FIG. 3 according to the first embodiment of the invention.
Figure 4B:
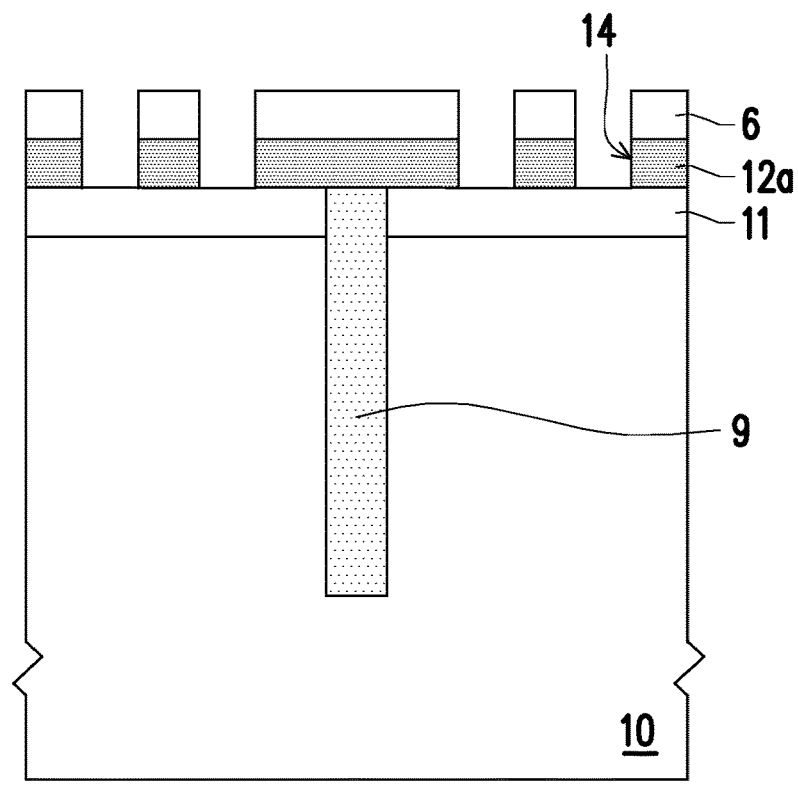
Figure 4C:
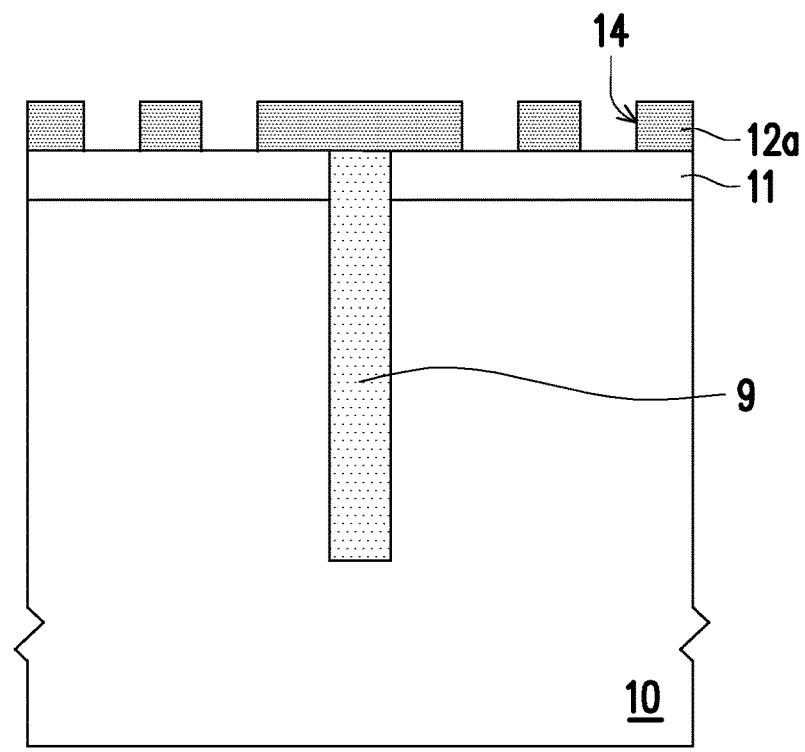
Figure 4D:
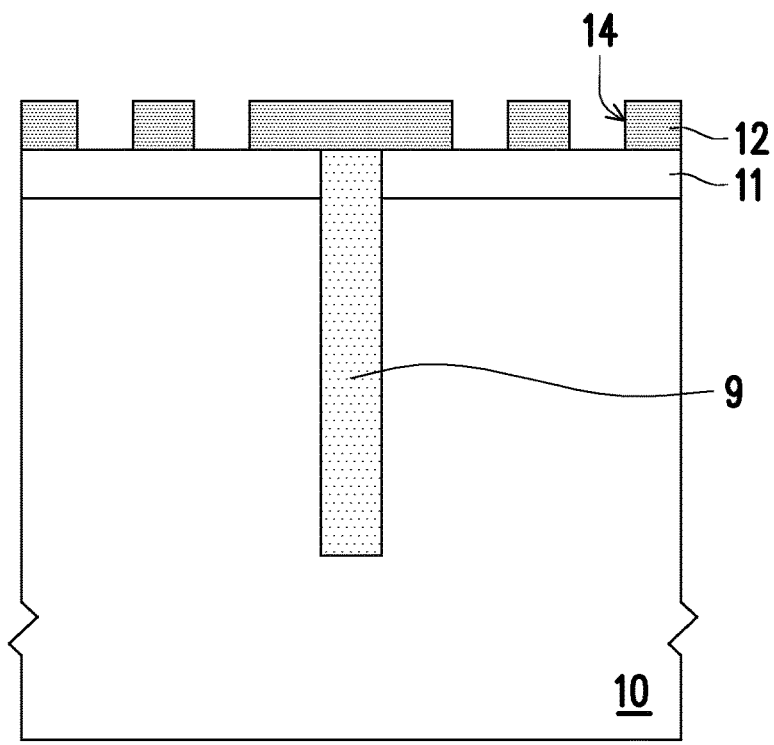
Figure 4E:
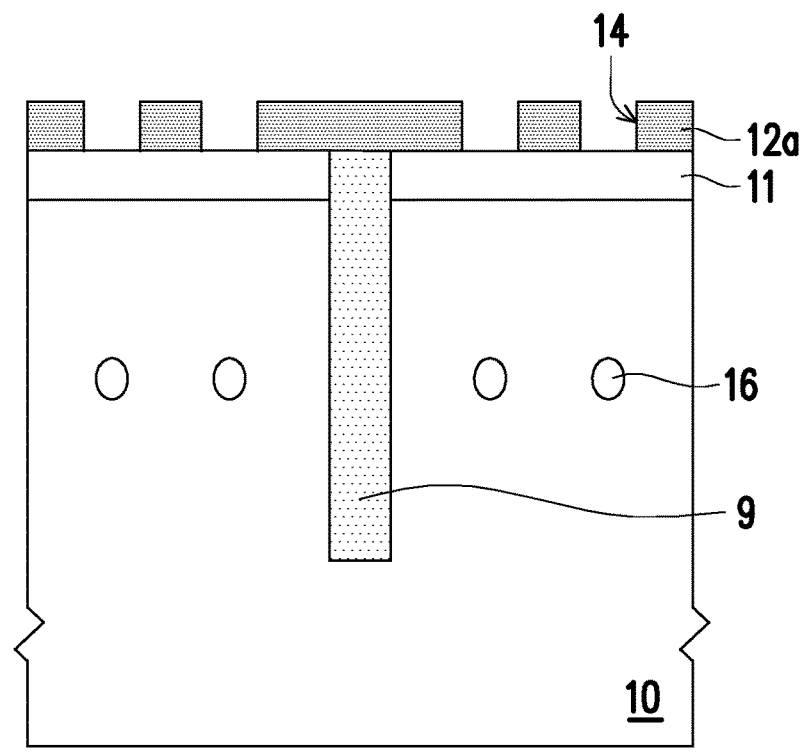
Figure 5E:
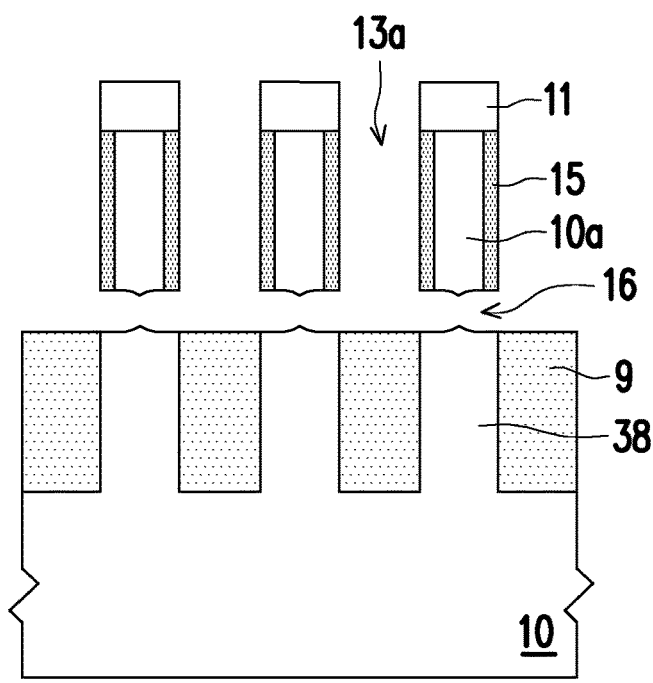
Figure 6E:
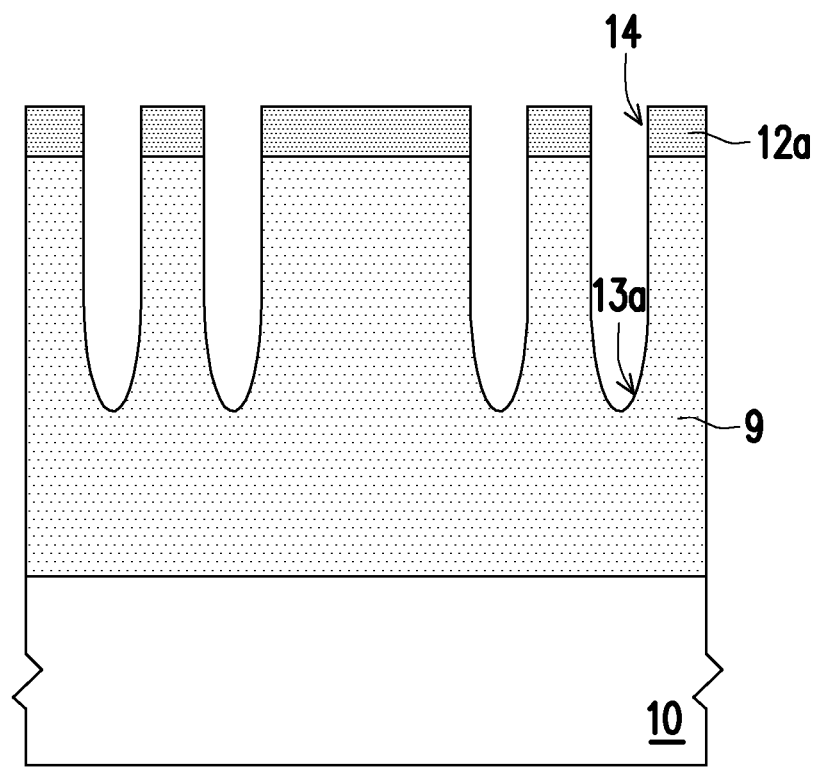
Figure 5F:
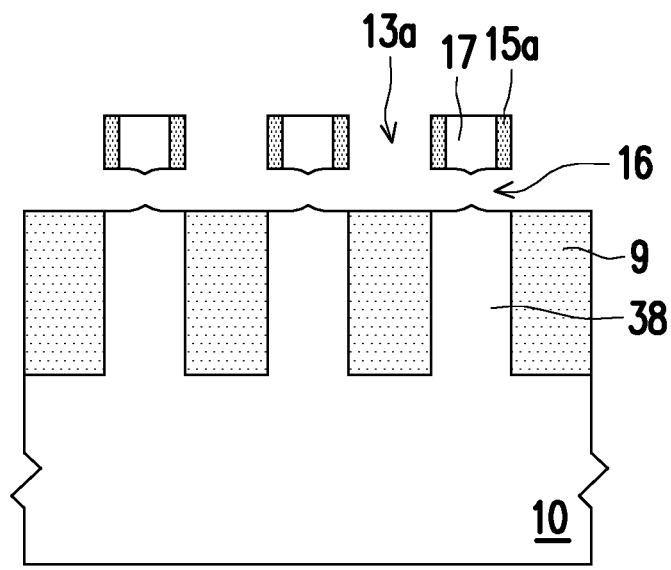
Figure 6F:
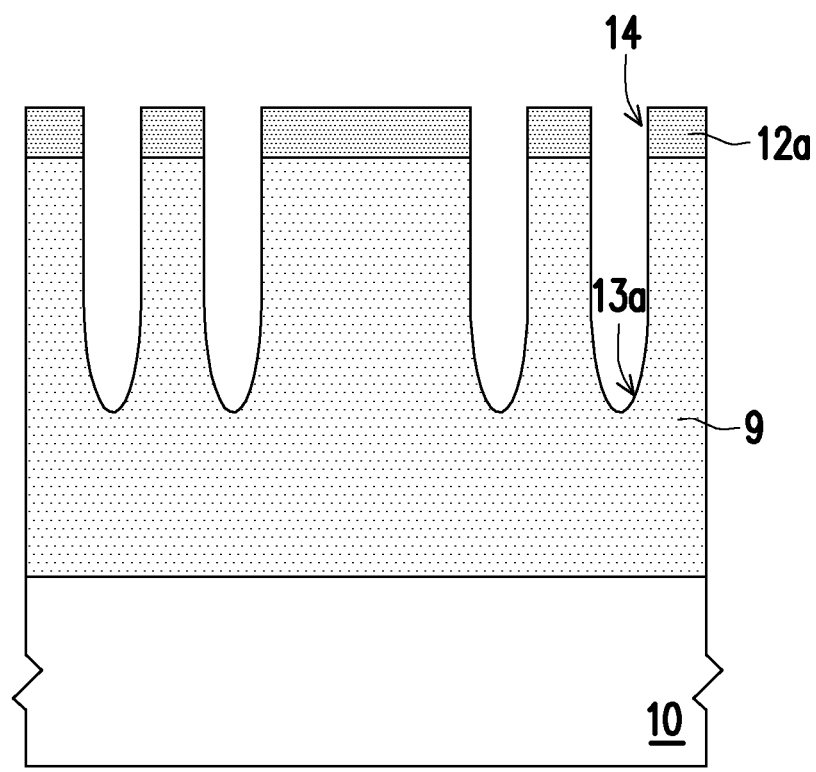

In some embodiments, the word line tunnel 16 is extended along the first direction D1 and is a columnar hole connected to the trench 13a (FIG. 5E). Referring to FIG. 4E, in some embodiments, the cross section of the word line tunnel 16 at the A-A' line segment is oval, circular, rectangular, square, or a combination thereof. Referring to FIG. 5E (cross section of the B-B' line segment of FIG. 2), the word line tunnel 16 is located between the first convex portion 10a and the substrate 10 to isolate the first convex portion 10a and the substrate 10. The top surface of the word line tunnel 16 is the bottom surface of the first convex portion 10a, and the bottom surface of the word line tunnel 16 is the surface of the substrate 10 in the word line region 7. In some embodiments, the bottom surface of the word line tunnel 16 and the surface of the isolation structure 9 are substantially level. However, the invention is not limited thereto. In some embodiments, the top surface and the bottom surface of the word line tunnel 16 are flat surfaces. In some other embodiments, the top surface and the bottom surface of the word line tunnel 16 are non-planar surfaces and are, for instance, v-shaped, r-shaped, γ-shaped, v-shaped, or a combination thereof. In some exemplary embodiments, the shape of the bottom surface of the word line tunnel 16 is the mirror image of the top surface.

Figure 14:
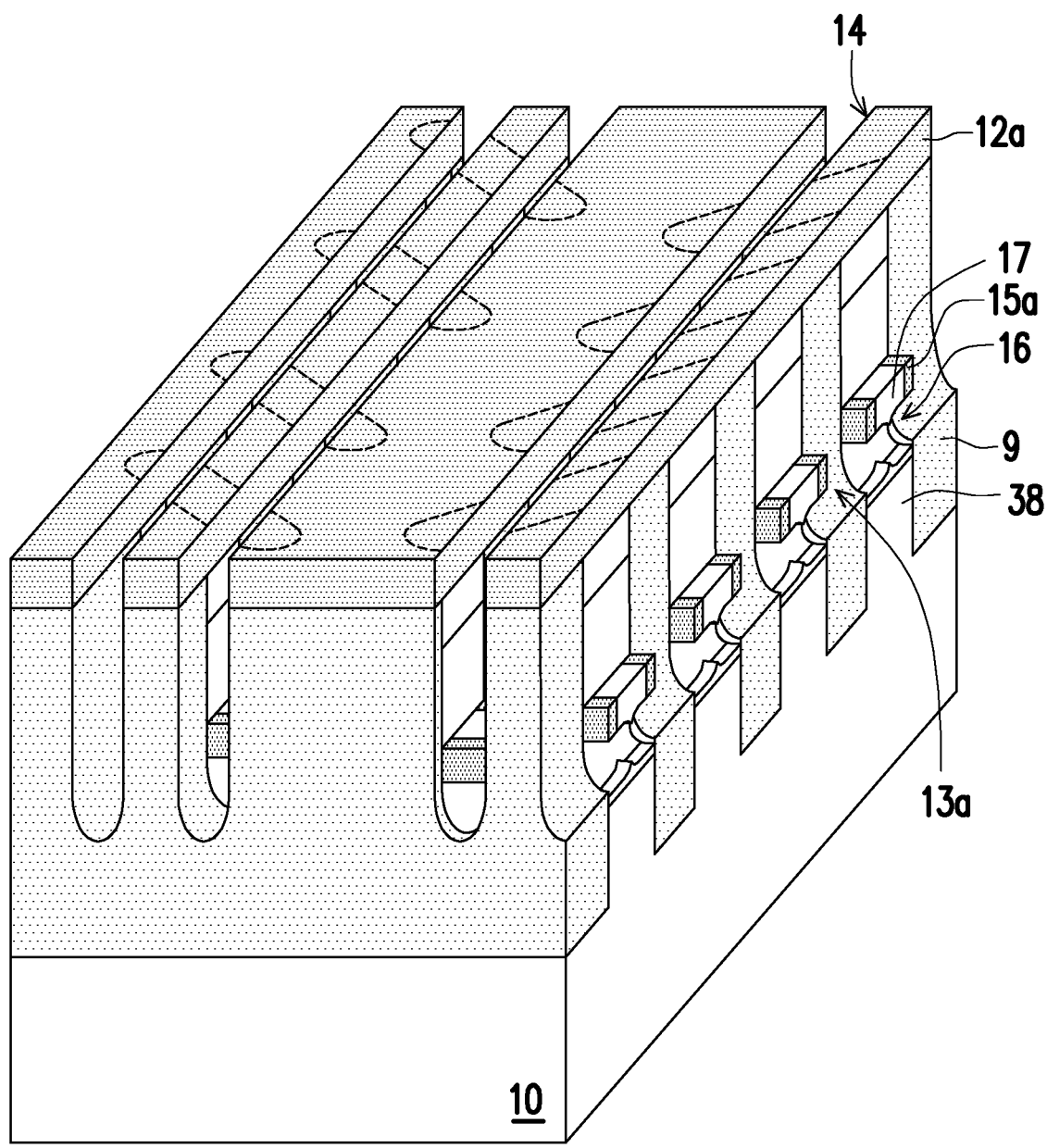

Referring to FIG. 2, FIG. 14, and FIG. 4F to FIG. 6F, the mask layer 11 on the first convex portion 10a, a portion of the first convex portion 10a, and a portion of the liner 15 in the word line region 7 are removed using the patterned hard mask layer 12a as a mask via, for instance, an etching method to form a gate trench 18 in the active regions 8. Here, the remaining first convex portions 10a are referred to as fin structures 17. The fin structures 17 have a liner 15a and are arranged in a column along the first direction D1. In some embodiments, the fin structures 17 are nanowire fin structures. Referring to FIG. 14, in the active regions 8 within the range of the word line region 7, the gate trench 18, the fin structures 17 and the liner 15a thereof, the word line tunnel 16, and the substrate 10 are arranged from top to bottom (in the third direction D3). The gate trench 18 connects the word line tunnel 16 and the trench 13a.

Referring to FIGS. 4G to 6G, next, the patterned hard mask layer 12a is removed. A dielectric material layer 19 is formed on the substrate 10 to cover the surfaces of the mask layer 11, the gate trench 18, and the word line tunnel 16. Here, the dielectric material layer 19 is used as the gate dielectric layer 19. The material of the gate dielectric layer 19 includes an insulation material, the insulation material is, for instance, silicon oxide, and the forming method is, for instance, a thermal oxidation method. Since the upper surface of the fin structures 17 is the bottom surface of the gate trench 18 and the lower surface of the fin structures 17 is the upper surface of the word line tunnel 16, the upper surface and the lower surface of the fin structures 17 are both covered by the gate dielectric layer 19. The gate dielectric layer 19 of the upper surface and the lower surface of the fin structures 17 and the liner 15a at the sidewall thereof form a shielding structure 20. In other words, the shielding structure 20 surrounds and covers the fin structures 17.

Figure 4F:
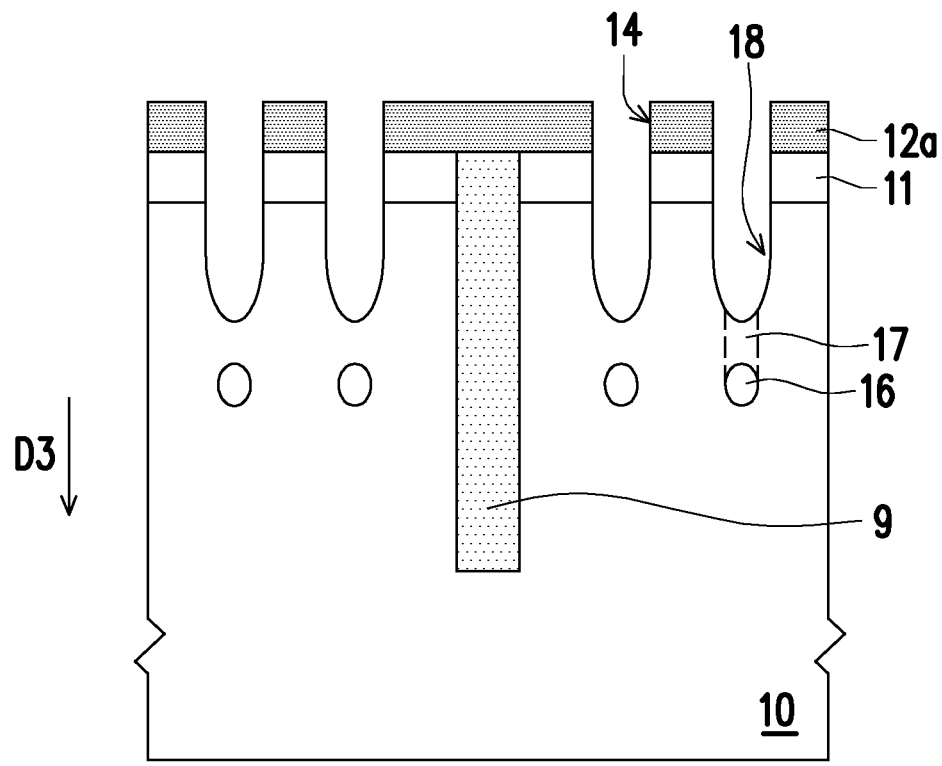
Figure 4G:
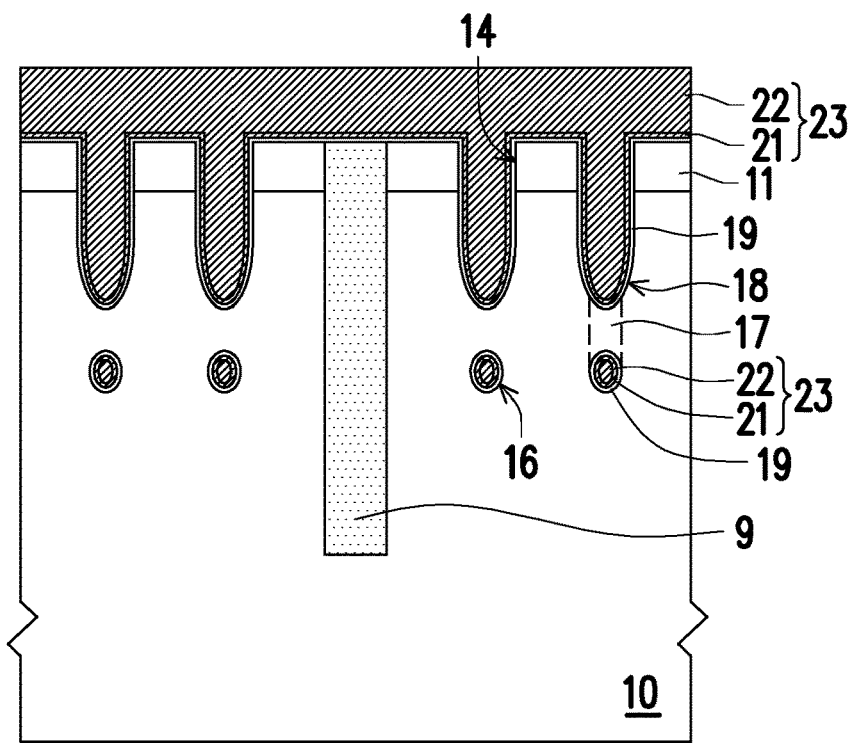
Figure 5G:
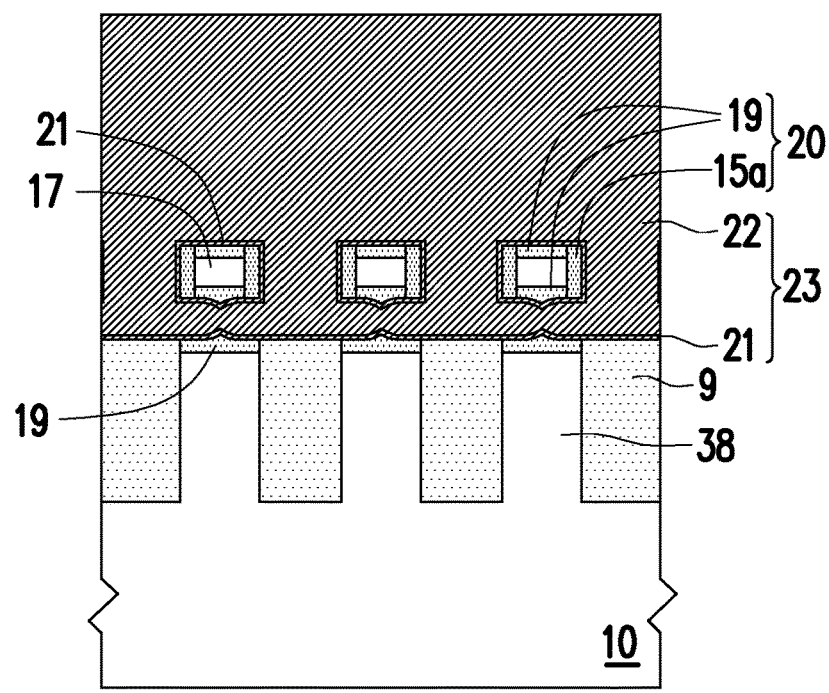
Figure 6G:
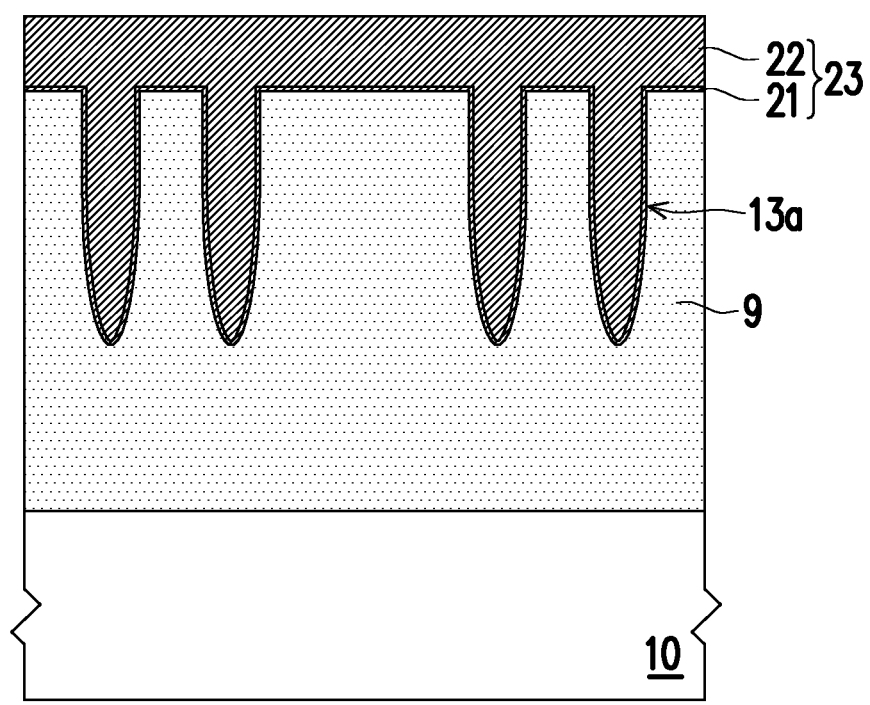

Referring further to FIG. 4G to FIG. 6G, a conductive layer 23 is formed on the substrate 10. The conductive layer 23 can be a single layer or multi-layer structure. The material of the conductive layer 23 is, for instance, a conductive material, and the conductive material is, for instance, metal, metal alloy, metal nitride, or a combination thereof. The metal material is, for instance, tungsten, aluminum, copper, or a combination thereof. The metal alloy is, for instance, copper aluminum alloy. The metal nitride is, for instance, titanium nitride, tantalum nitride, or a combination thereof. In some embodiments, the conductive layer 23 is a two-layer structure and the forming method thereof includes forming a first conductive layer 21 and a second conductive layer 22 in order. The first conductive layer 21 can be used as an adhesive layer or a barrier layer. The material of the first conductive layer 21 is, for instance, metal nitride such as titanium nitride or tantalum nitride. The material of the second conductive layer 22 is, for instance, metal or metal alloy such as tungsten, aluminum, copper, or copper aluminum alloy. The conductive layer 23 is filled in the trench 13a, the gate trench 18, and the word line tunnel 16, and covers the isolation structure 9, the fin structures 17, and the mask layer 11. In the gate trench 18, the conductive layer 23 covers the surface of the gate dielectric layer 19. In the word line tunnel 16, the conductive layer 23 is surrounded by the gate dielectric layer 19 (FIG. 4G). From another perspective, the conductive layer 23 surrounds the fin structures 17 (FIG. 5G).

Referring to FIG. 15, FIG. 4G to FIG. 6G, and FIG. 4H to FIG. 6H, the conductive layer 23 on the mask layer 11 and the isolation structure 9, and the gate dielectric layer 19 on the mask layer 11 are removed, and a portion of the conductive layer 23 in the gate trench 18 and the trench 13a is removed to form a conductive layer 23a. The conductive layer 23a includes a first conductive layer 21a and a second conductive layer 22a. The removal method can be an etching process or a chemical mechanical polishing method and an etching process.

Figure 4H:
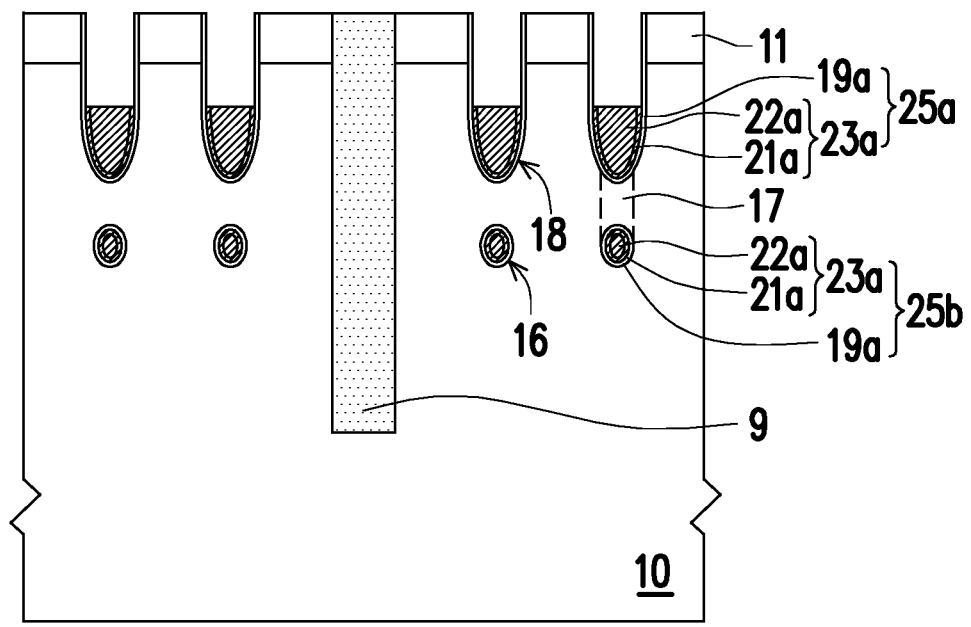

Referring to FIG. 4H, the conductive layer 23a and the gate dielectric layer 19 in the gate trench 18 form a first buried gate structure 25a. The conductive layer 23a and the gate dielectric layer 19 in the word line tunnel 16 form a second buried gate structure 25b. The bottom surface and the sidewall of the first buried gate structure 25a are covered by the substrate 10. The second buried gate structure 25b is surrounded and covered by the substrate 10. The substrate 10 between the first buried gate structure 25a and the second buried gate structure 25b is the fin structure 17.

Figure 5H:
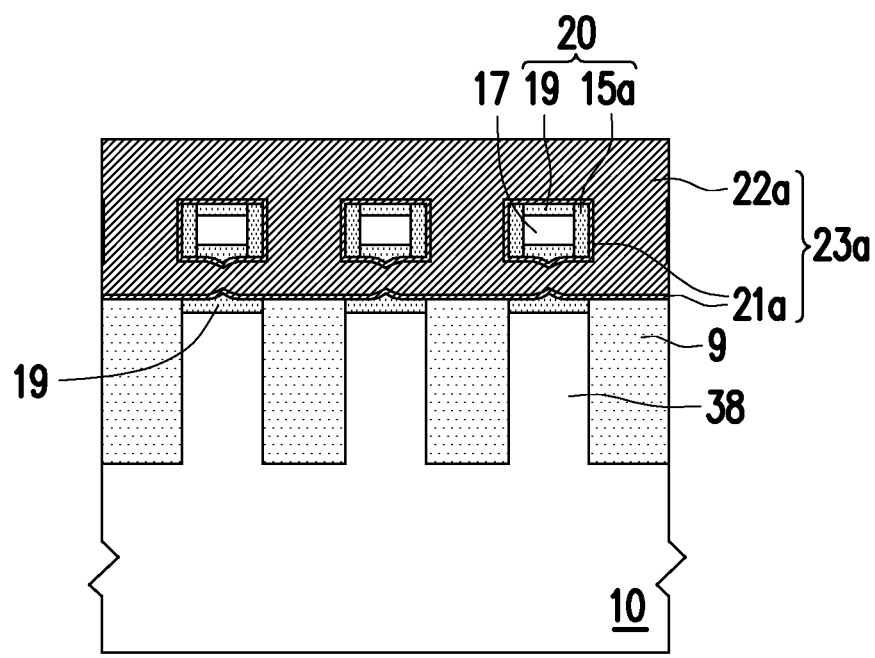
Figure 6H:
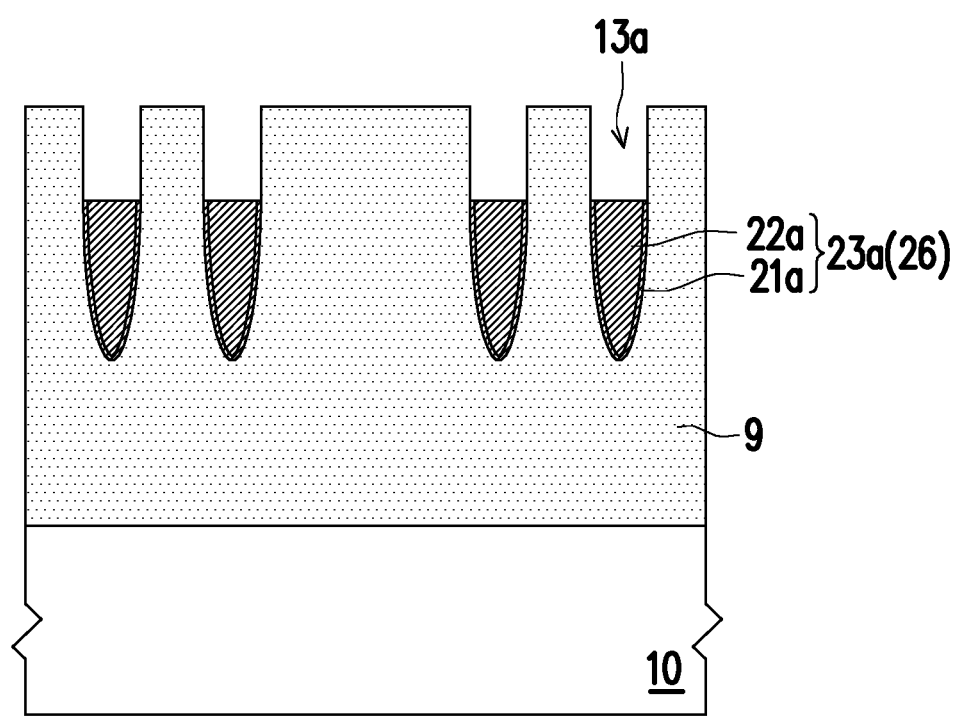
Figure 5I:
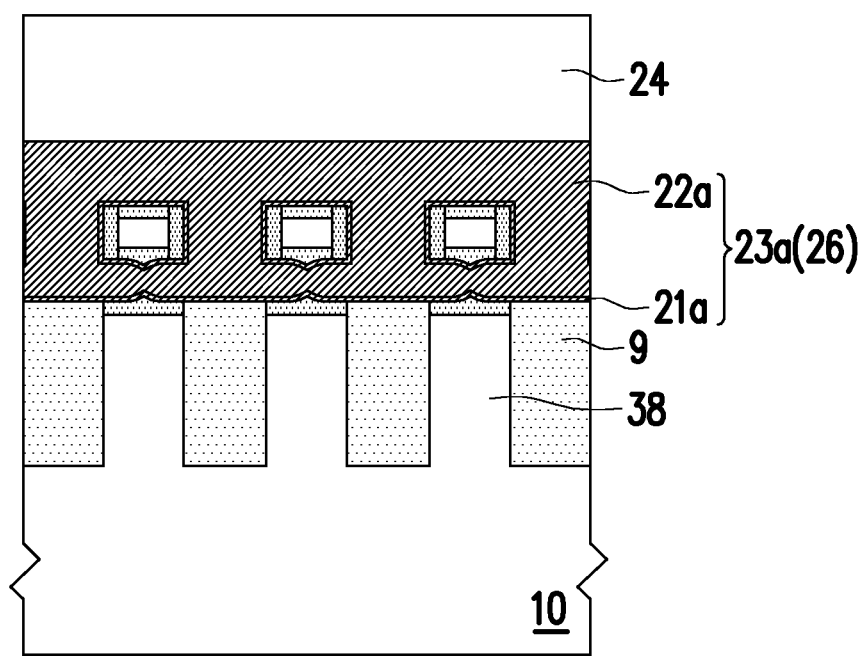
Figure 6I:
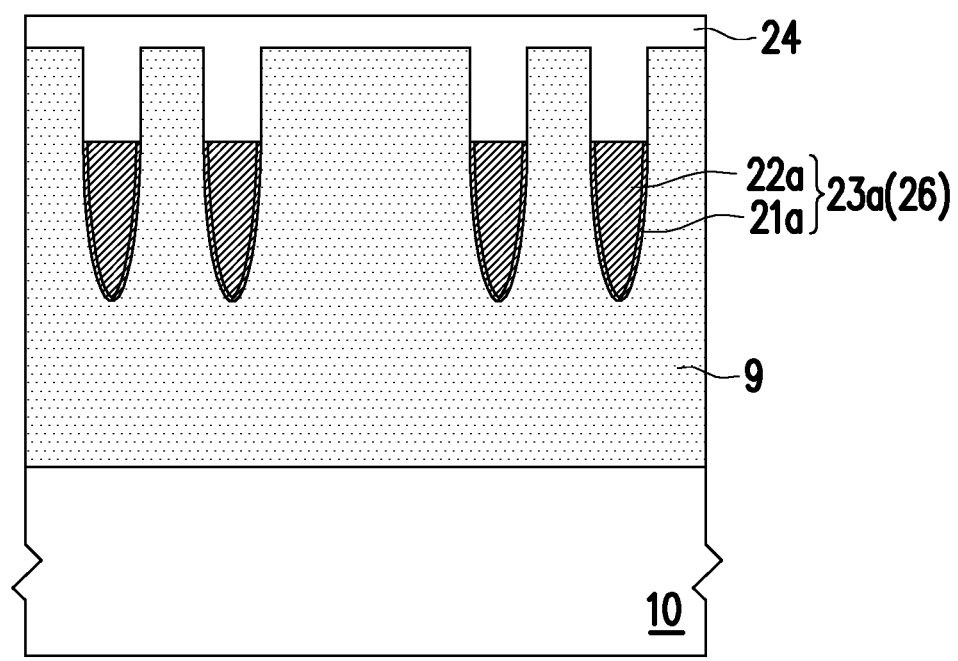
Figure 15:
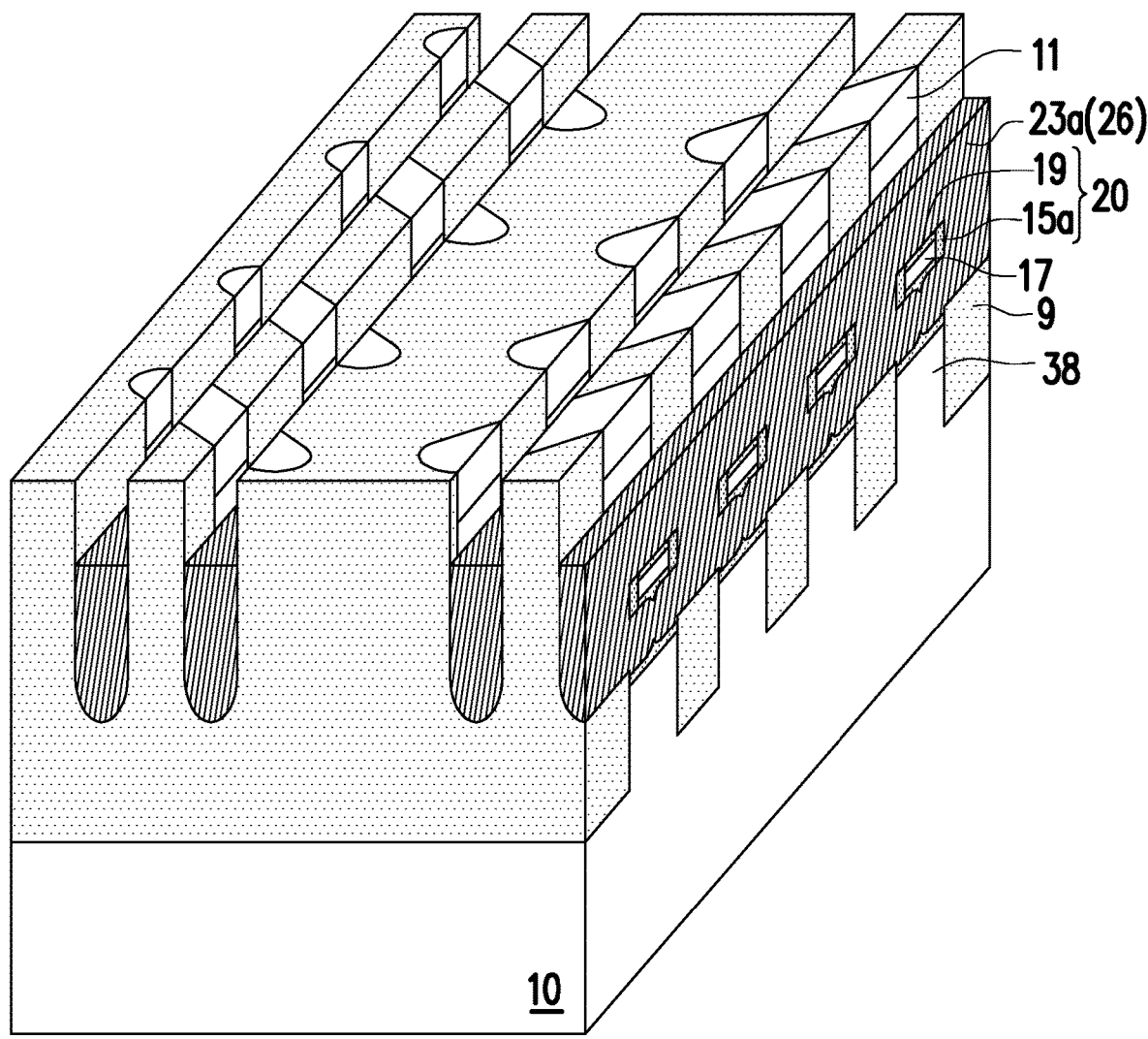
Figure 16:
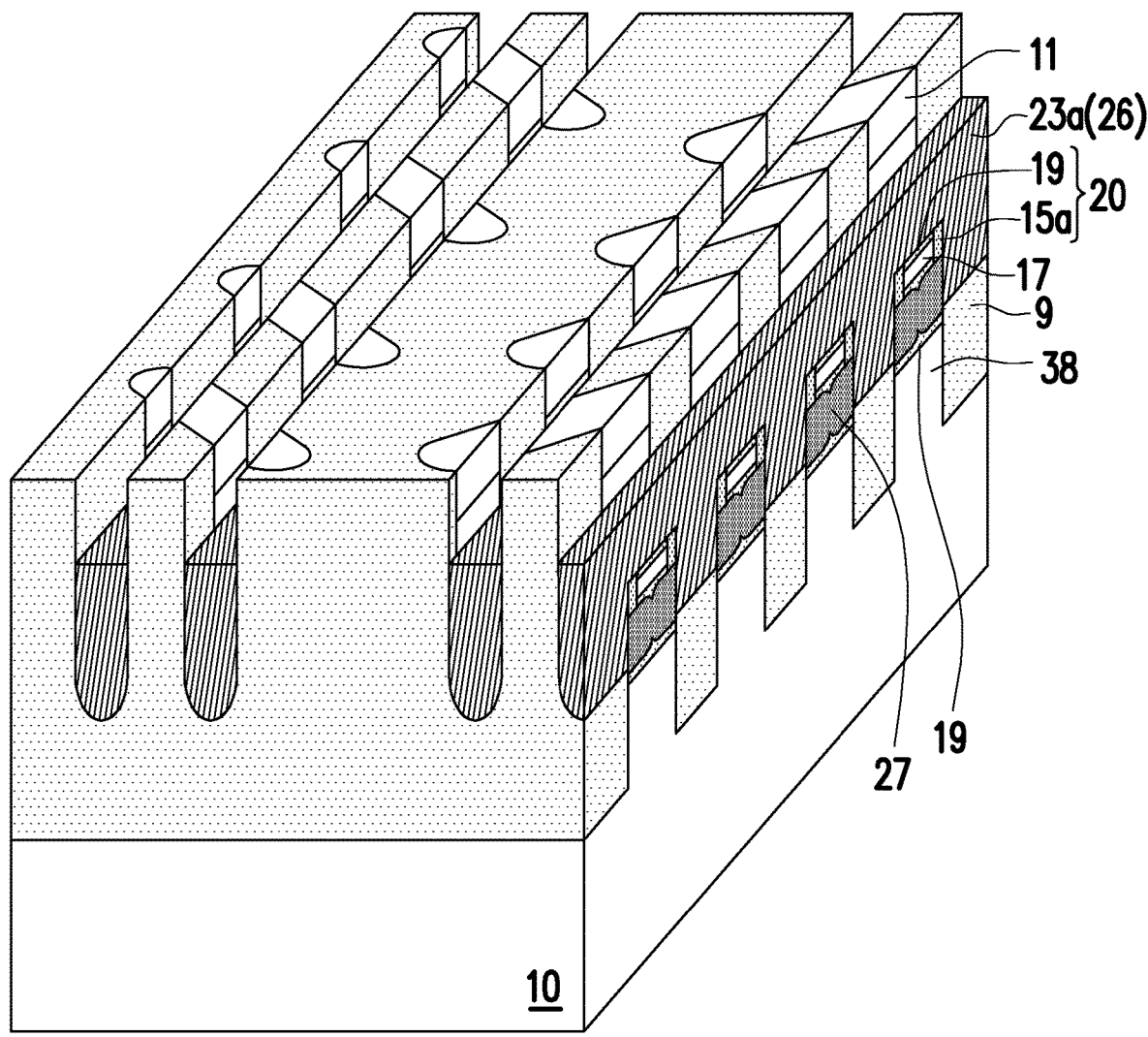
FIG. 16 is a 3D diagram of the dynamic random access memory according to the second embodiment of the invention.

Referring to FIG. 15 and FIG. 5H, here, the conductive layer 23a is used as a buried word line structure 26. The buried word line structure 26 is extended along the first direction D1 and located in the trench 13a, the gate trench 18, and the word line tunnel 16. The surface of the fin structures 17 is covered by the shielding structure 20 and the fin structures 17 are located in the buried word line structure 26 and surrounded and covered by the buried word line structure 26.

Referring to FIG. 4I to FIG. 6I, a dielectric layer 24 is formed on the substrate 10 to be filled in the trench 13a and the gate trench 18, and the dielectric layer 24 covers the buried word line structure 26, the isolation structure 9, and the mask layer 11. The dielectric layer 24 can be a single layer or a double layer. The material of the dielectric layer 24 includes an insulation material. The insulation material is, for instance, silicon oxide, silicon nitride, or a combination thereof. The forming method of the dielectric layer 24 is, for instance, a chemical vapor deposition method.

Figure 4I:
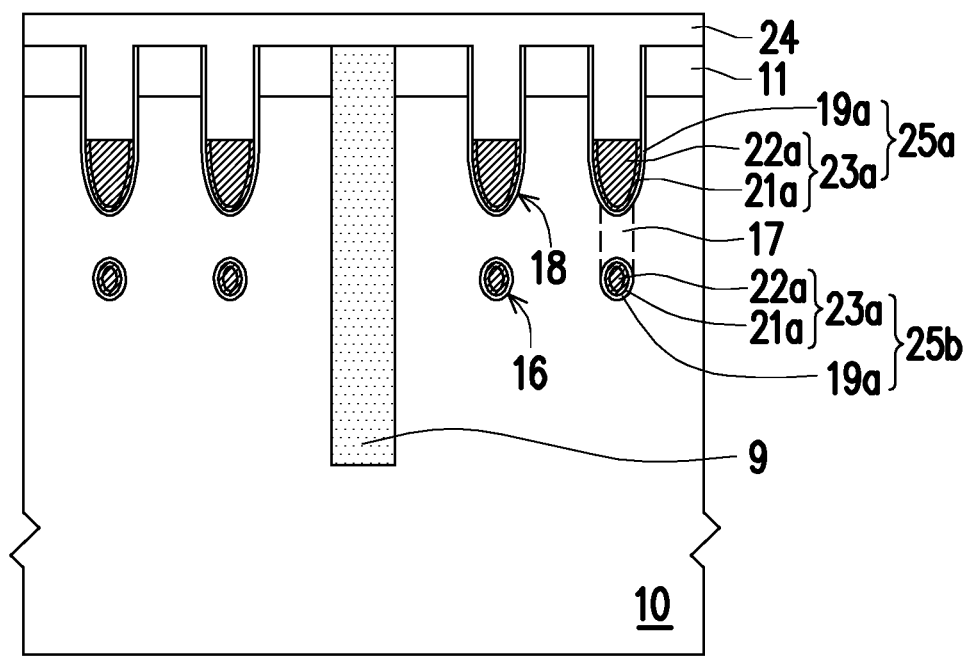
Figure 4J:
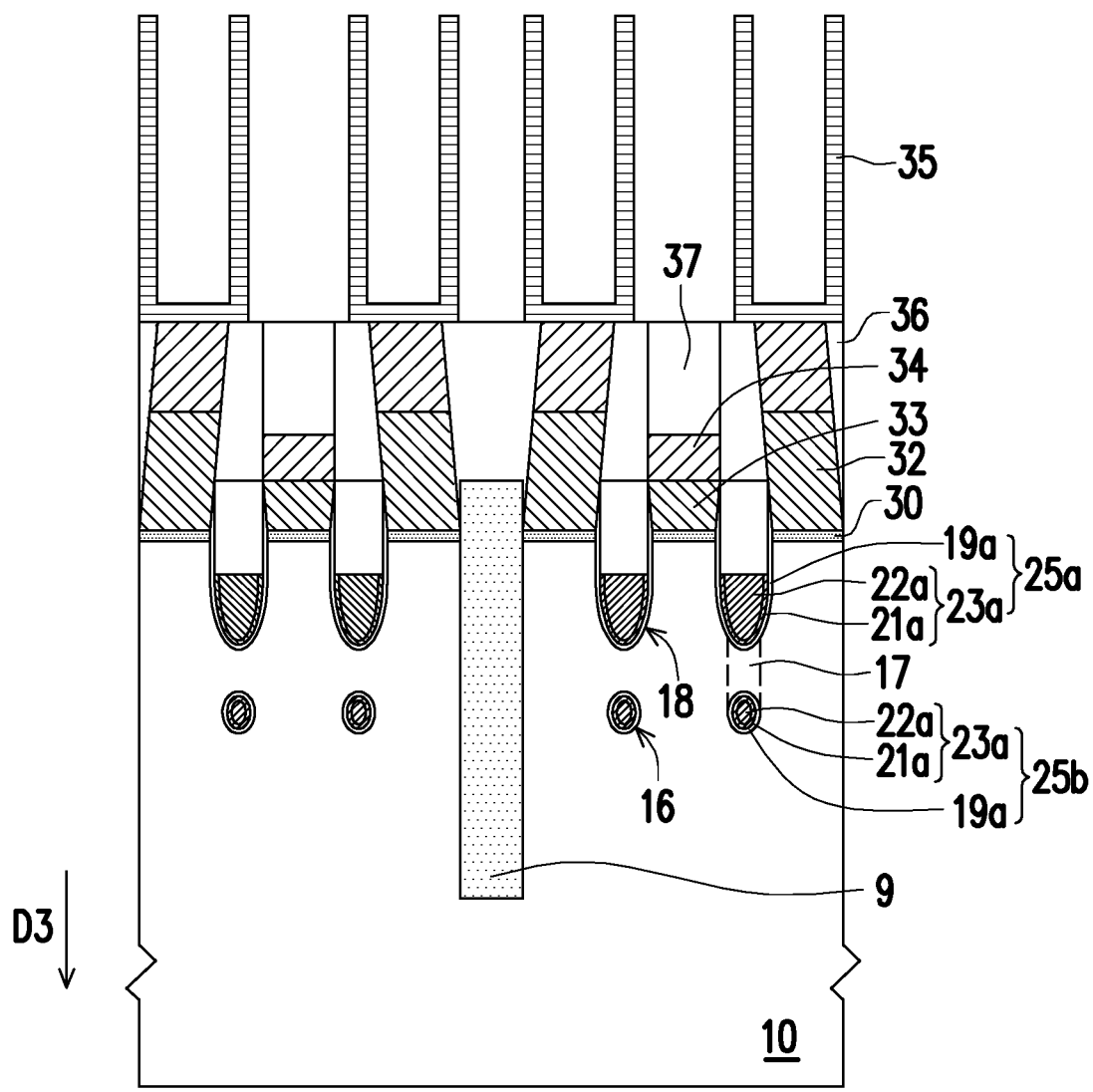
Figure 5J:
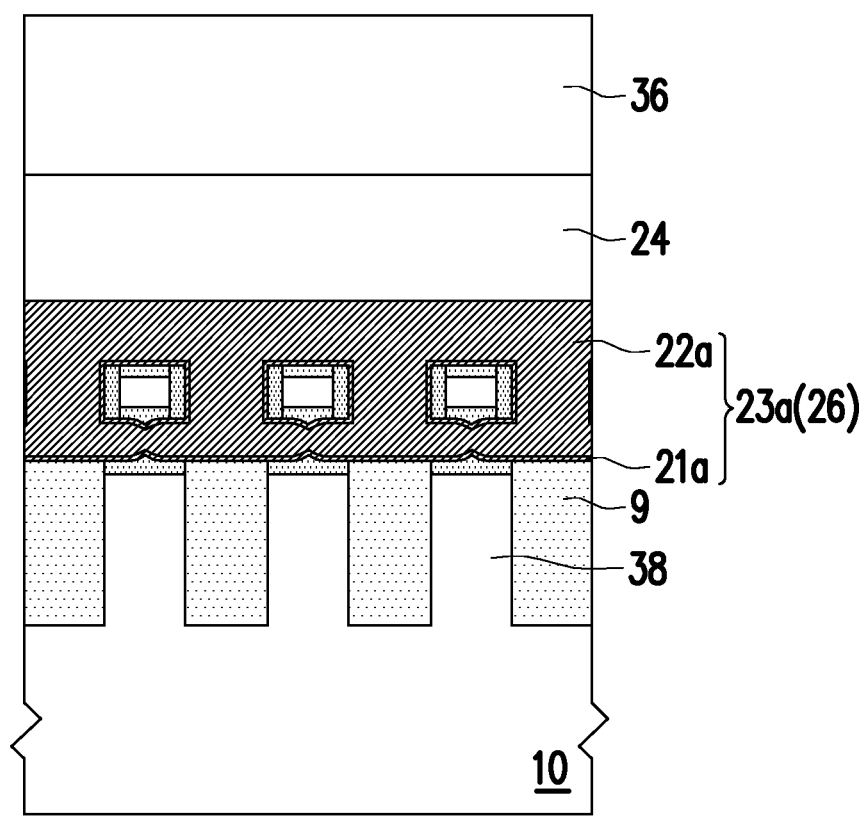
Figure 8A:
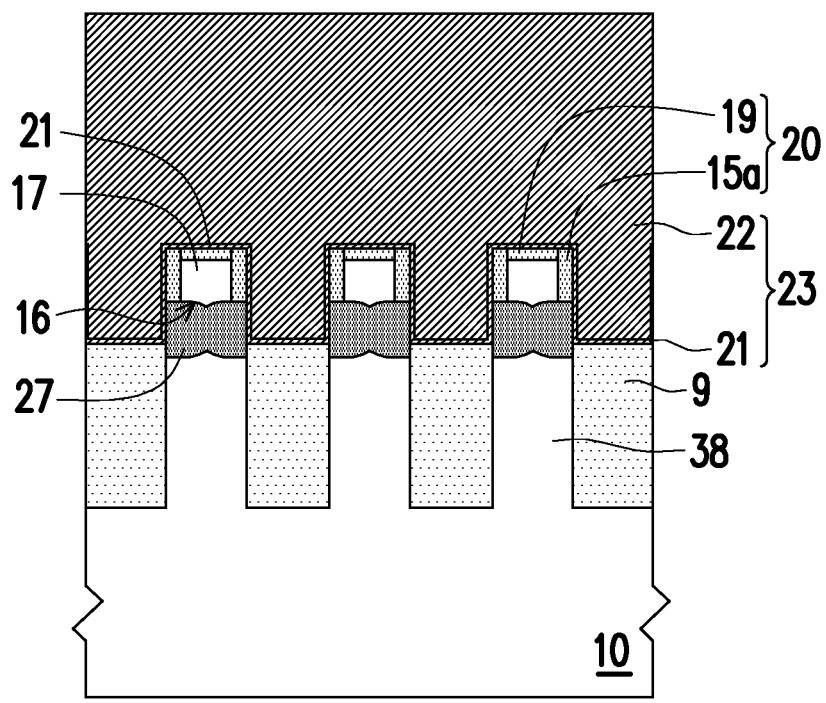
FIG. 8A to FIG. 8D are cross-sectional schematic diagrams of the fabrication method process of the dynamic random access memory of the B-B' line segment in FIG. 3 according to the second embodiment of the invention.
Figure 9A:
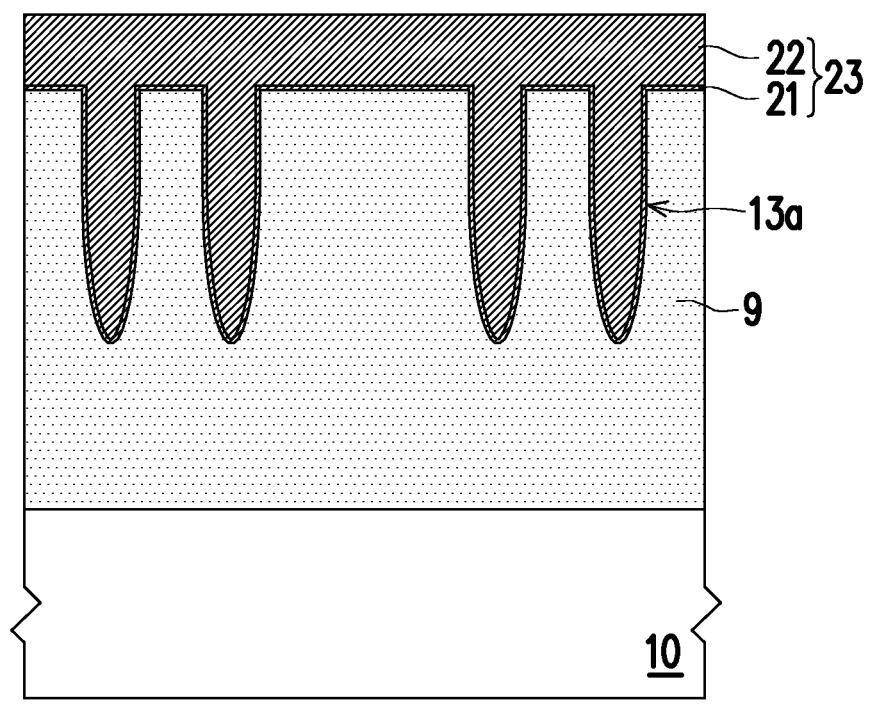
FIG. 9A to FIG. 9C are cross-sectional schematic diagrams of the fabrication method process of the dynamic random access memory of the C-C' line segment in FIG. 3 according to the second embodiment of the invention.
Figure 8B:
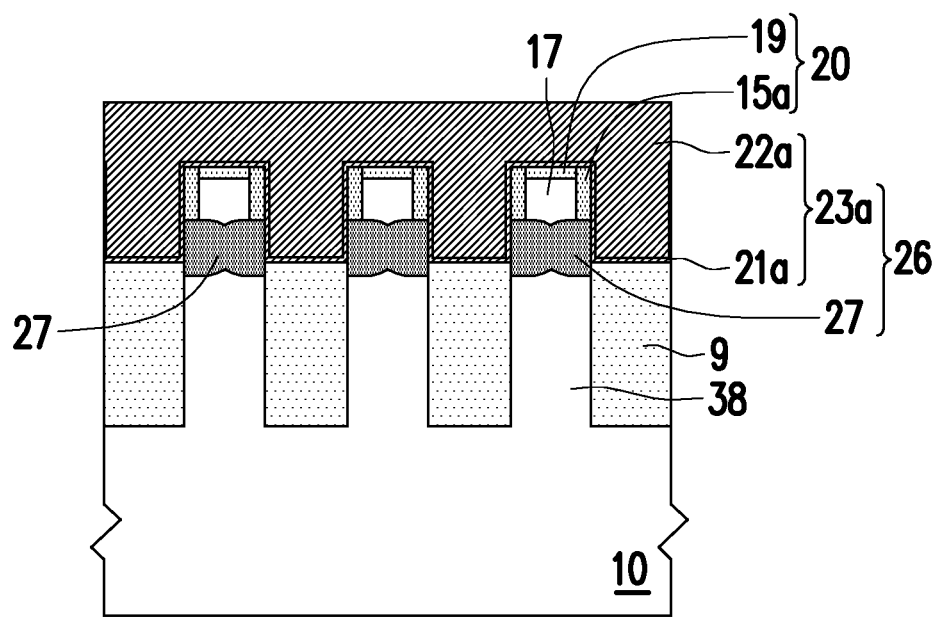
Figure 9B:
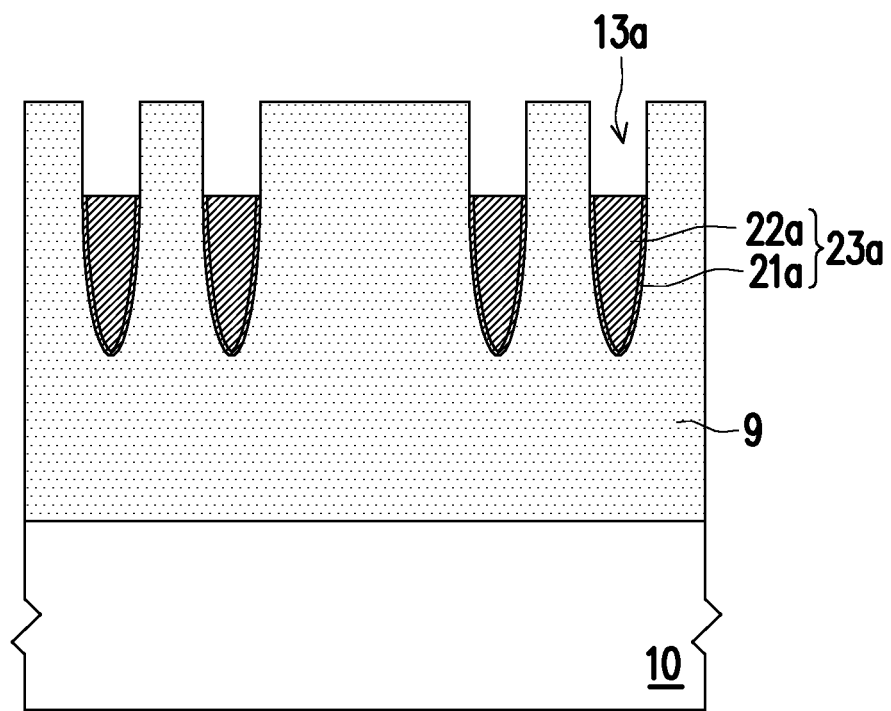
Figure 8C:
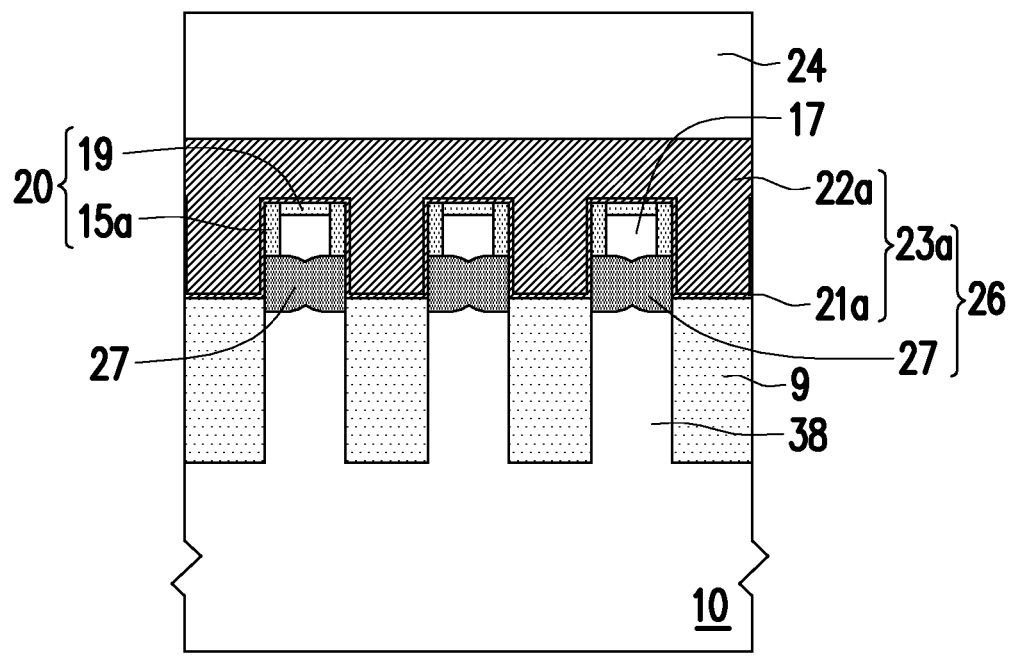
Figure 9C:
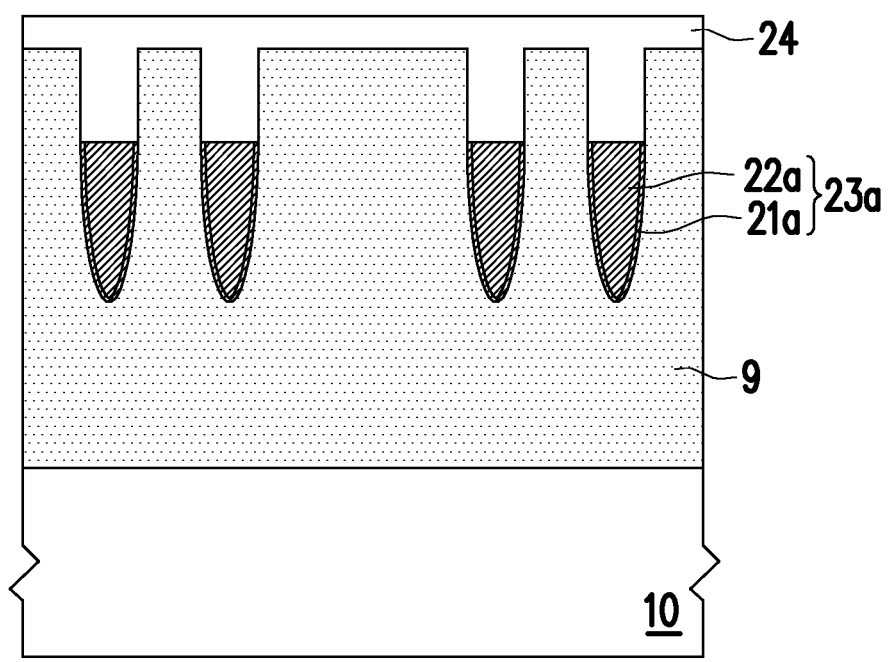

Next, other components are formed on the substrate 10. Referring to FIG. 3, FIG. 4J, and FIG. 5J, the dielectric layer 24 and the mask layer 11 above the mask layer 11 are removed. Source and drain regions 30 are formed in the substrate 10 in the active regions 8 at two sides of the first buried gate structure 25a. The source and drain regions 30 can be formed by implanting a dopant in the substrate 10 in the active regions 8 using an ion implantation method. Next, a dielectric layer 36, a bit line contact 33, a capacitor contact 32, a bit line 34, and a capacitor 35 are formed. The bit line 34 is electrically connected to one of the source and drain regions 30 via the bit line contact 33. The capacitor 35 is electrically connected to the other of the source and drain regions 30 via the capacitor contact 32.

Referring to FIG. 3 and FIG. 4J, the dynamic random access memory according to an embodiment of the invention includes the substrate 10, the isolation structure 9, the buried word line structure 26, and the bit line 34. The buried word line structure 26 is extended along the first direction D1 and across the active regions 8 and the isolation structure 9. The bit line 34 is extended along the second direction D2 and across the isolation structure 9, the active regions 8, and the buried word line structure 26. In some embodiments, the buried word line structure 26 and the bit line 34 are perpendicular to each other, but are not limited thereto.

The active regions 8 at two sides of each of the buried word line structures 26 include a bit line contact 33 and a capacitor contact 32. The bit line 34 is electrically connected to one of the source and drain regions 30 of the active regions 8 via the bit line contact 33. The capacitor 35 is electrically connected to the other of the source and drain regions 30 of the active regions 8 via the capacitor contact 32.

In some embodiments, each of the active regions 8 is crossed by two buried word line structures 26. Moreover, in each of the active regions 8, the source and drain regions 30 located between two buried word line structures 26 are electrically connected to a bit line 34 via the bit line contact 33. In each of the active regions 8, two source and drain regions 30 located outside two buried word line structures 26 are electrically connected to the capacitor 35 via the capacitor contact 32. That is, the capacitors 35 of the same active region column R1/R2 are arranged in two columns along the first direction D1. Moreover, two adjacent capacitors 35 of two adjacent active regions 8 in the same active region column R1 are arranged in a column with two adjacent capacitors 35 of two adjacent active regions 8 in the adjacent active region column R2. In other words, the capacitors 35 on the active region columns R1 and R2 are arranged in an array. From another perspective, the capacitors 35 and the bit lines 34 in the same column are alternately arranged along the first direction D1. Each of the capacitors 35 in the same row is located between two adjacent bit lines 34 along the second direction D2.

Each of the active regions 8 is intersected by two buried word line structures 26. One buried gate structure (25a/25b) and one fin structure 17 are at each intersection. Therefore, the buried gate structures (25a/25b)/fin structures 17 are arranged in a column along the first direction D1. In each of the active regions 8, the buried gate structures (25a/25b)/fin structures 17 are arranged along the length direction of the active regions 8. Since the length direction and column direction second direction D2 of the active regions 8 are non-orthogonal and form an angle θ, two adjacent columns of buried gate structures (25a/25b)/fin structures 17 in the same active region column R1 (or R2) are staggered with each other.

Referring to FIG. 4J, in the active regions 8, the dynamic random access memory of the present embodiment includes the first buried gate structure 25a, the fin structures 17, the second buried gate structure 25b, and the substrate 10 from top to bottom along the D3 direction. In some embodiments, the first buried gate structure 25a is curved, semi-circular, or semi-elliptical. The second buried gate structure 25b is circular, oval, rectangular, square, or a combination thereof, but the invention is not limited thereto.

Based on the above, the dynamic random access memory of the present embodiment has fin structures and is surrounded by the buried word line structure, such that the performance of the device can be improved. Embodiments can improve the switching performance of the device, reduce the threshold voltage (Vt) thereof, and reduce the channel dosage, such that refresh performance is improved. Moreover, in some embodiments, the second buried gate structure is completely surrounded and covered by the substrate such that channel resistance can be reduced and the performance of write recovery time (tWR) thereof is improved as a result.

FIGS. 7A to 9A and FIG. 7C to 9C are cross-sections according to another embodiment of the invention. FIG. 7A to FIG. 7D, FIG. 8A to FIG. 8D, and FIG. 9A to FIG. 9C are respectively cross-sectional schematic diagrams of the fabrication method process of the dynamic random access memory according to the second embodiment of the invention at A-A', B-B', and C-C' line segments in FIG. 3. The difference between the present embodiment and the embodiments above is that the word line tunnel 16 forms the insulation structure 27. The detailed description is given as follows.

Referring to FIG. 7A to FIG. 9A, after the word line tunnel 16 and the gate trench 18 are formed according to the steps shown in FIG. 4F to FIG. 6F, the dielectric material layer 27 is formed in the word line tunnel 16. Here, the dielectric material layer 27 is also referred to as the insulation structure 27. The material of the insulation structures 27 includes an insulation material such as silicon oxide, silicon nitride, or a combination thereof. The forming method is, for instance, a thermal oxidation method or a chemical vapor deposition method. In some embodiments, an insulation material layer is deposited on the substrate 10 using a chemical vapor deposition method, wherein the insulation material layer is filled in the word line tunnel 16, and then the insulation material layer outside the word line tunnel 16 is removed via an etching method to form the insulation structures 27 in the word line tunnel 16.

Referring further to FIG. 7A to FIG. 9A, next, a gate dielectric layer 19 is formed in the active regions 8 in the word line region 7. The material of the gate dielectric layer 19 includes an insulation material, the insulation material is, for instance, silicon oxide, and the forming method is, for instance, a thermal oxidation method or a chemical vapor deposition method. In some embodiments, the gate dielectric layer 19 and the insulation structures 27 can be formed at the same time. The insulation structures 27 separate the fin structures 17 and the substrate 10.

Referring further to FIG. 7B to FIG. 9B, FIG. 7C to FIG. 9C, and FIG. 16, next, the conductive layer 23a and the dielectric layer 24 are formed on the substrate 10 according to the same method above. The conductive layer 23 is filled in the trench 13a and the gate trench 18 and covers the isolation structure 9. Since the word line tunnel 16 is filled with the insulation structures 27, the conductive layer 23 is not filled in the word line tunnel 16. The conductive layer 23 covers the top surface and the sidewall of the shielding structure 20 of the fin structures 17 and the sidewall of the insulation structures 27. In other words, in some embodiments, the conductive layer 23a is a plurality of continuous reverse-U shapes (FIG. 8B). The fin structures 17 and the insulation structures 27 are located in the openings of the reverse-U shapes of the conductive layer 23a and are engaged with the conductive layer 23a. The lower portion of the conductive layer 23a (corresponding to the isolation structure 9) is separated by the fin structures 17 and the insulation structures 27 and is not continuous. The conductive layer 23a and the insulation structures 27 form the buried word line structure 26, and the buried word line structure 26 surrounds and covers the fin structures 17.

Next, referring to FIG. 7D to FIG. 8D, the source and drain regions 30, the dielectric layer 36, the bit line contact 33, the capacitor contact 32, the bit line 34, and the capacitor 35 are formed according to the above method.

Figure 7A:
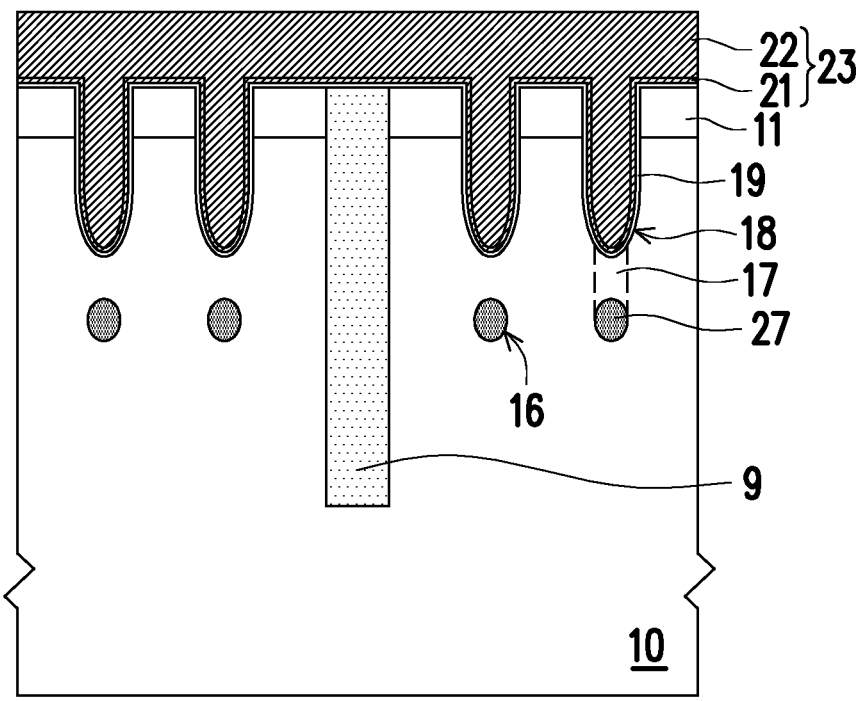
FIG. 7A to FIG. 7D are cross-sectional schematic diagrams of the fabrication method process of the dynamic random access memory of the A-A' line segment in FIG. 3 according to the second embodiment of the invention.
Figure 7B:
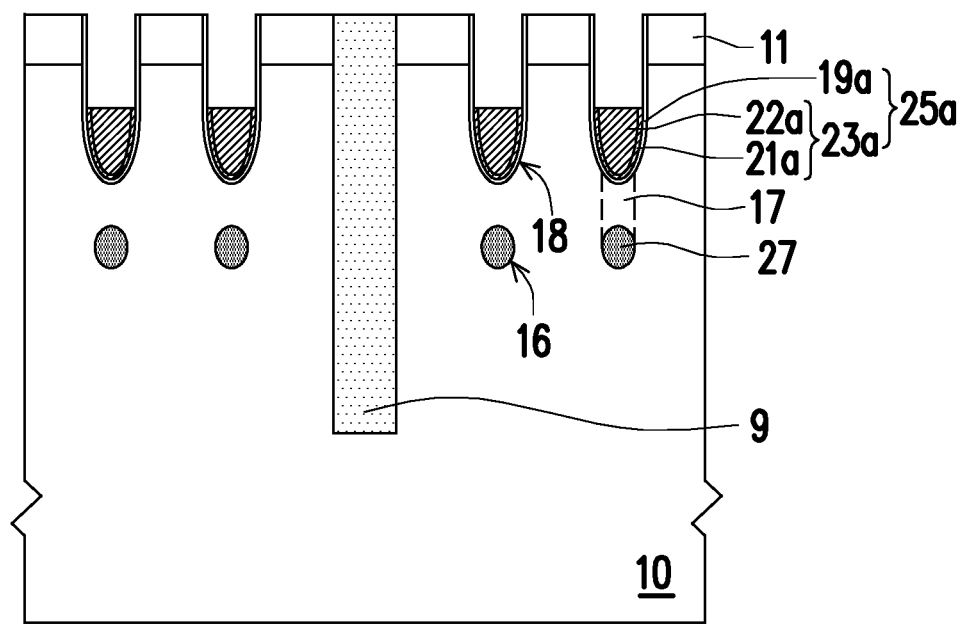
Figure 7C:
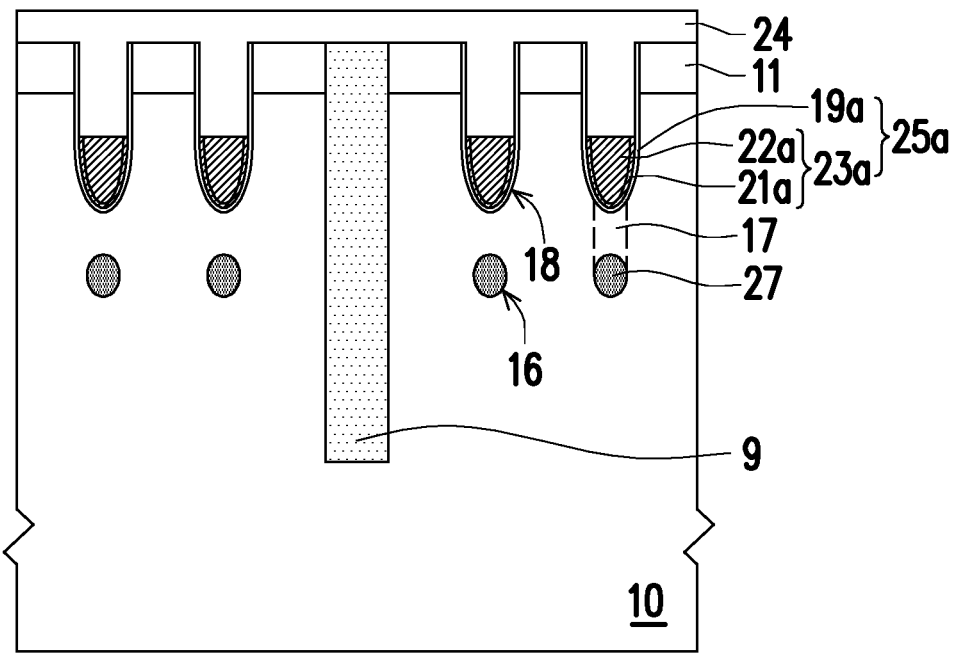
Figure 7D:
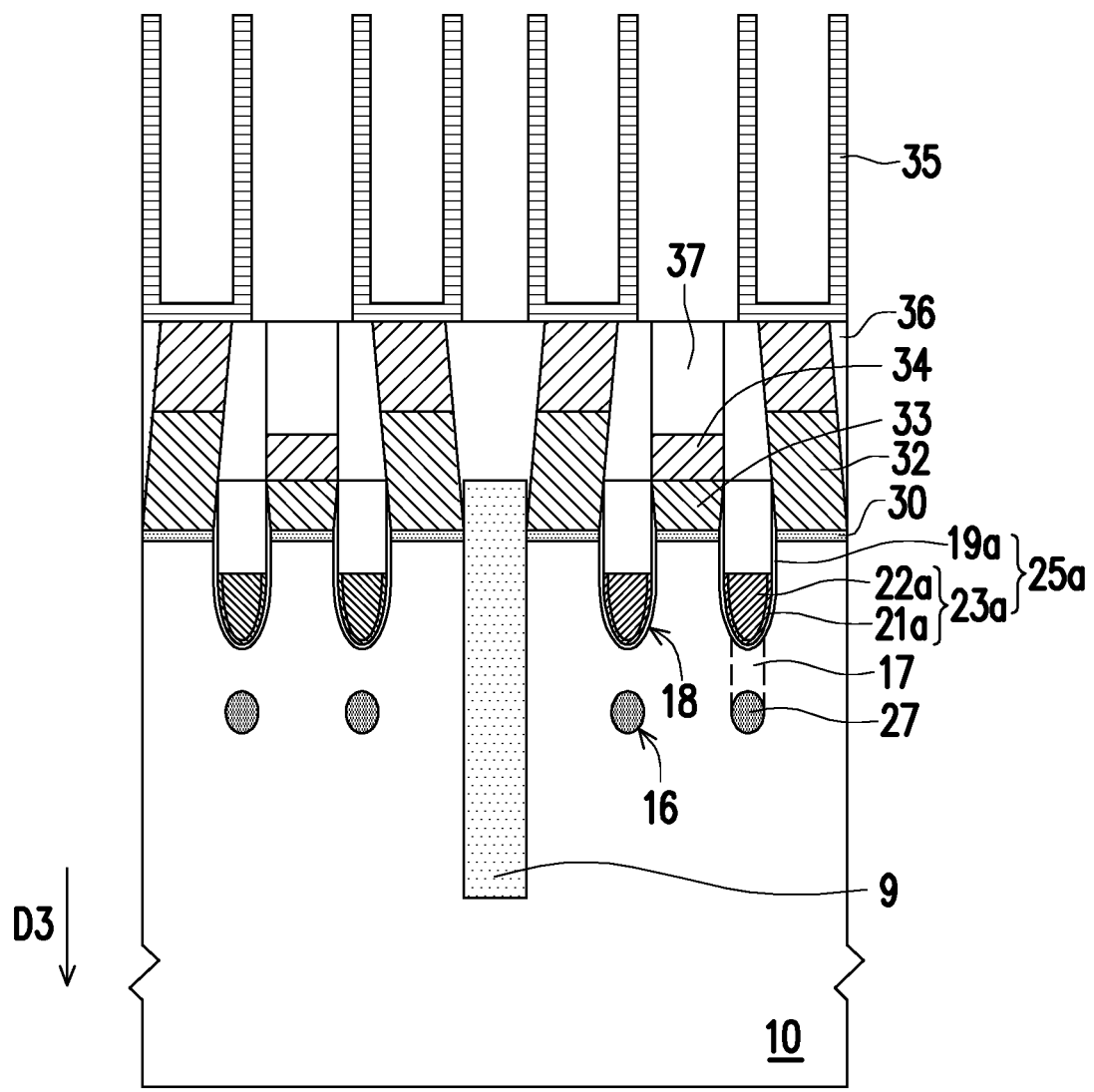

Referring to FIG. 7D, the dynamic random access memory of the present embodiment includes the first buried gate structure 25a, the fin structures 17, the insulation structures 27, and the substrate 10 from top to bottom along the third direction D3 in active regions 8. Moreover, the capacitor 35 is electrically connected to one of the source and drain regions 30 via the capacitor contact 32. The bit line 34 is electrically connected to the other of the source and drain regions 30 via the bit line contact 33.

Figure 8D:
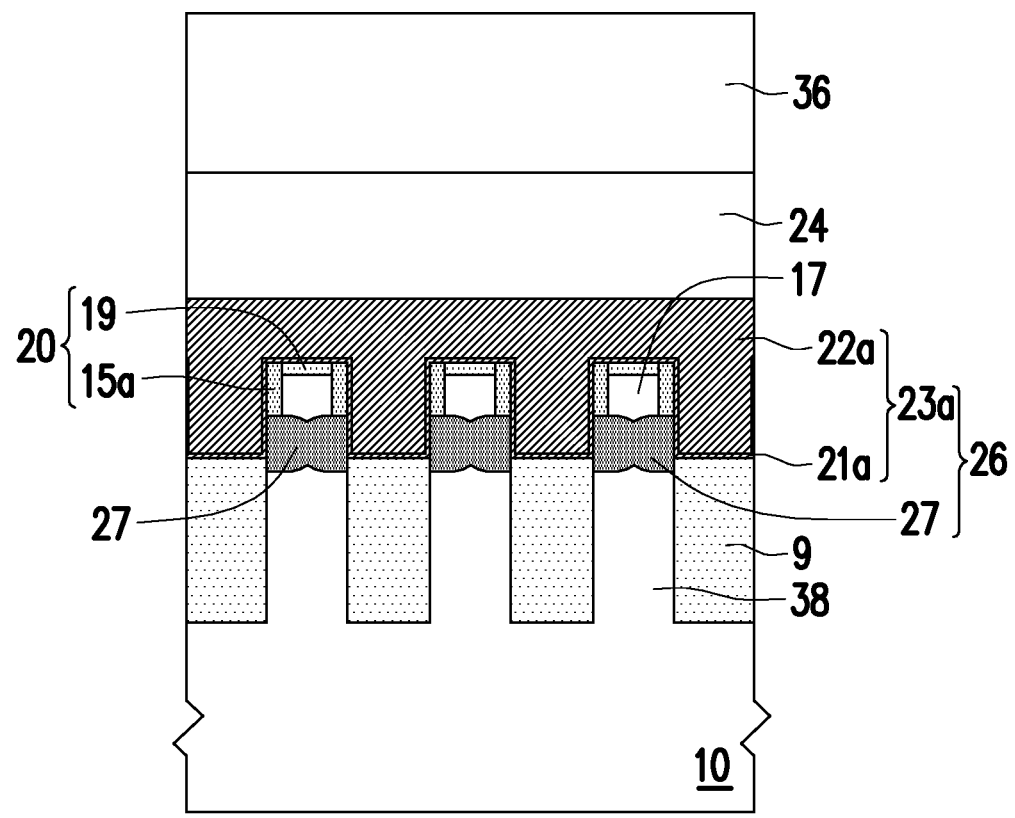
Figure 11A:
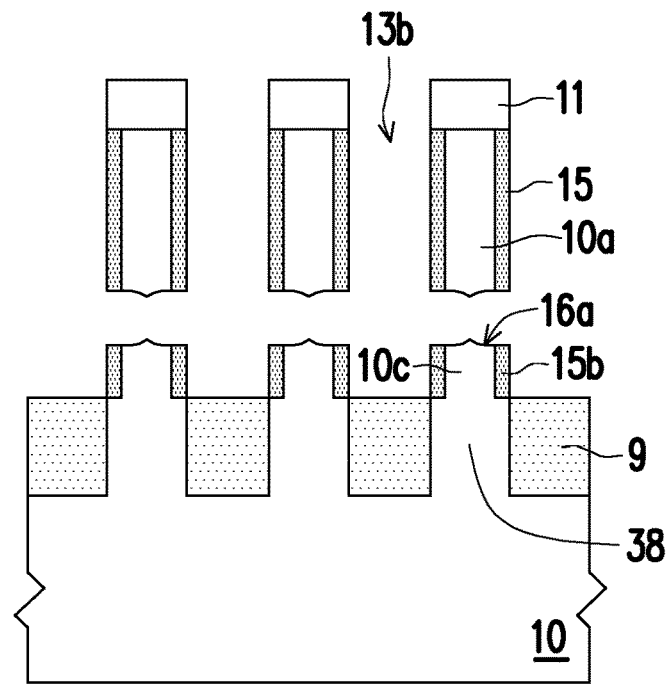
FIG. 11A to FIG. 11G are cross-sectional schematic diagrams of the fabrication method process of the dynamic random access memory of the B-B' line segment in FIG. 3 according to the third embodiment of the invention.
Figure 12A:
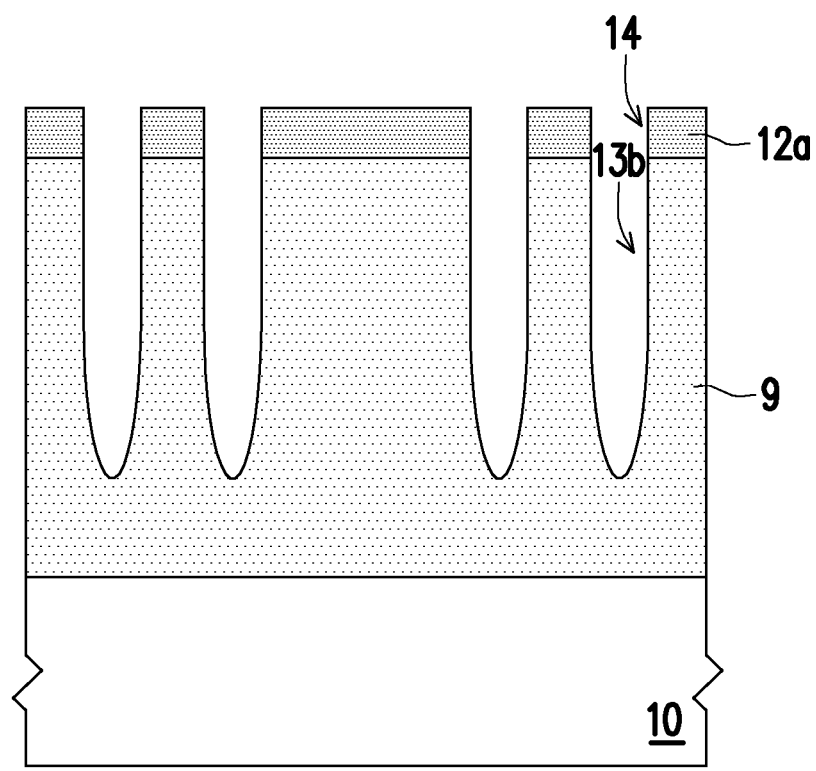
FIG. 12A to FIG. 12F are cross-sectional schematic diagrams of the fabrication method process of the dynamic random access memory of the C-C' line segment in FIG. 3 according to the third embodiment of the invention.
Figure 11B:
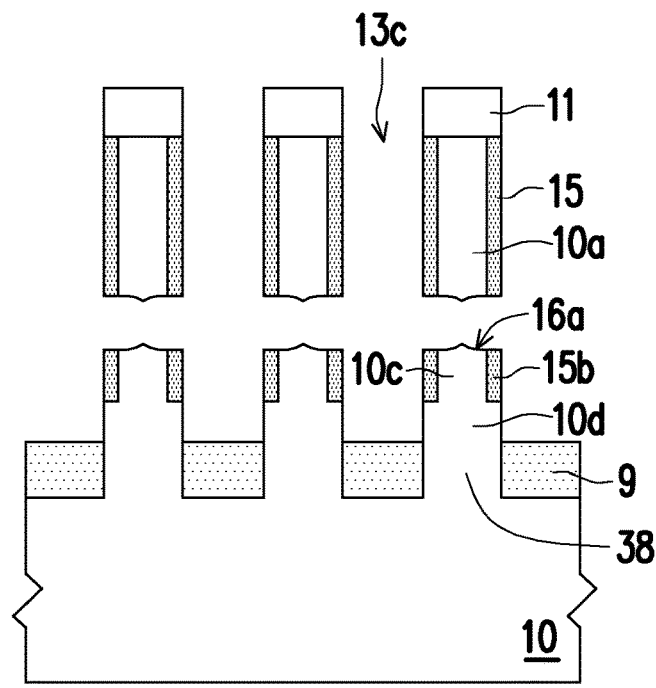
Figure 12B:
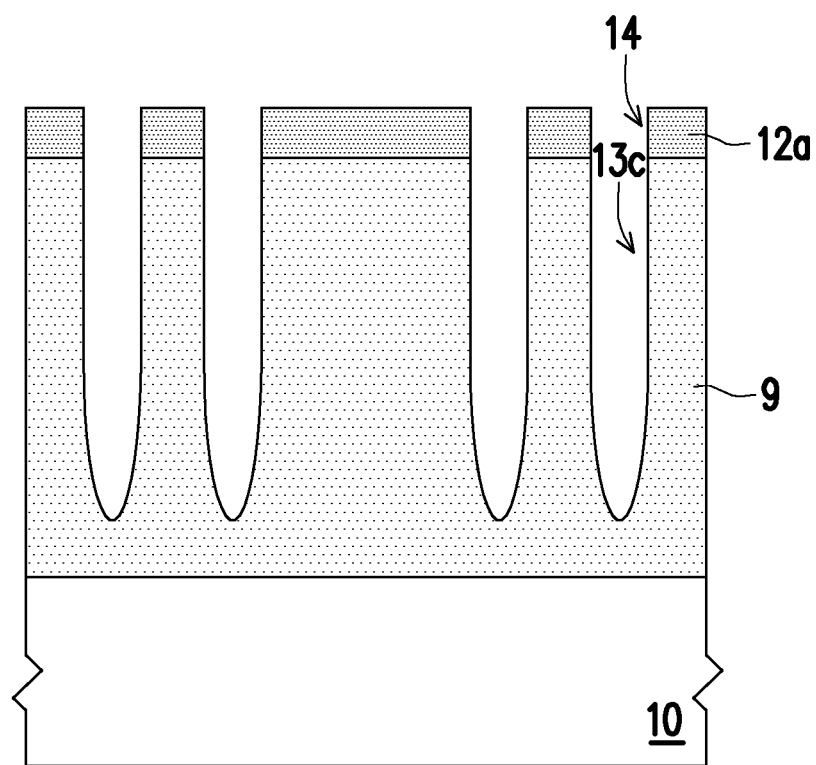

Referring to FIG. 8D, next, in the present embodiment, the fin structures 17 are surrounded and covered by the buried word line structure 26. Moreover, the insulation structures 27 of the buried word line structure 26 are located between the fin structures 17 and the substrate 10 to separate the fin structures 17 and the substrate 10.

In the dynamic random access memory of the present embodiment, the fin structures and the substrate are separated by the insulation structures such that the fin region can produce lower depletion layer capacitance to effectively improve device performance.

FIG. 10A to FIG. 10G, FIG. 11A to FIG. 11G, and FIG. 12A to FIG. 12F are respectively cross-sectional schematic diagrams of the fabrication method process of the dynamic random access memory according to the third embodiment of the invention at A-A', B-B', and C-C' line segments in FIG. 3. The difference between the present embodiment and the first embodiment is that two word line tunnels 16a and 16b are formed. Specifically, a second word line tunnel 16b is further formed, and a third buried gate structure 25c is formed in the second word line tunnel 16b. The detailed description is given as follows.

Referring to FIG. 10A to FIG. 12A. In the present embodiment, the word line tunnel 16 is referred to as a first word line tunnel 16a. After the steps of forming the first word line tunnel 16a according to the method corresponding to FIG. 4E to FIG. 6E in the first embodiment, the first convex portion 10a of the convex portion 38 and the convex portion 38 below the first word line tunnel 16a (a third convex portion 10c) are protected, and a portion of the convex portion 38 below the third convex portion 10c (a fourth convex portion 10d) is removed to form the second word line tunnel 16b in the substrate 10. This step is described in detail below.

Referring to FIG. 4E to FIG. 6E and FIG. 10A to FIG. 12A, after the steps of forming the first word line tunnel 16a and the trench 13a according to the method corresponding to FIG. 4E to FIG. 6E in the first embodiment, a portion of the isolation structure 9 below the trench 13a is removed (such as etching) using the patterned hard mask layer 12a and the mask layer 11 as a mask to form a trench 13b. The trench 13b is deeper than the trench 13a such that the third convex portion 10c of the convex portion 38 of the substrate 10 is exposed (FIG. 11A). Next, a liner 15b is formed on the sidewall of the third convex portion 10c. The material of the liner 15b includes an insulation material. The insulation material is, for instance, silicon oxide.

Referring to FIG. 10B to FIG. 12B, a portion of the isolation structure 9 below the trench 13b is removed using the patterned hard mask layer 12a and the mask layer 11 as a mask to form a trench 13c. The trench 13c is deeper than the trench 13b and the fourth convex portion 10d of the convex portion 38 of the substrate 10 is exposed.

Figure 10A:
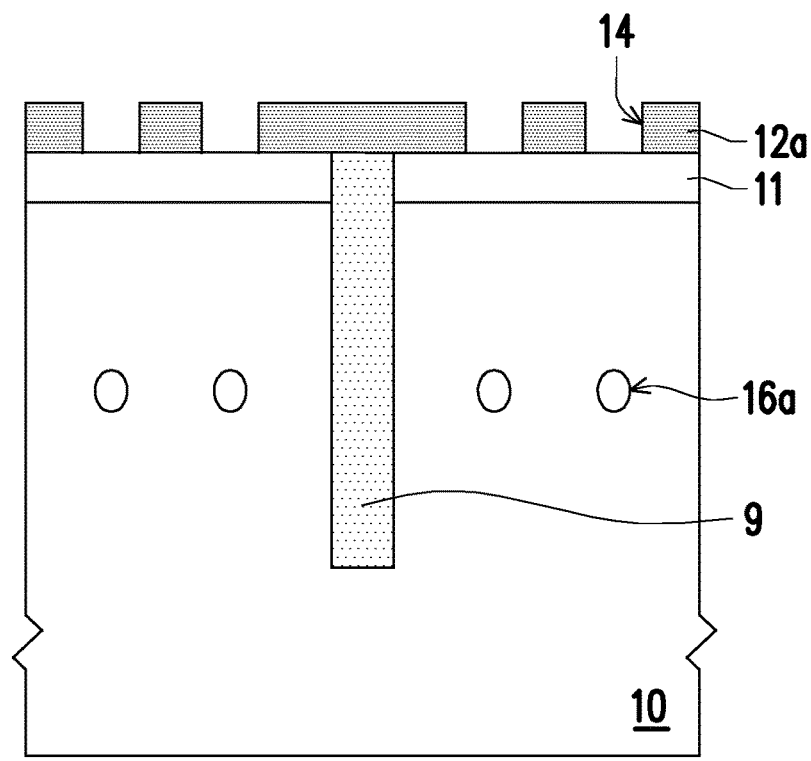
FIG. 10A to FIG. 10G are cross-sectional schematic diagrams of the fabrication method process of the dynamic random access memory of the A-A' line segment in FIG. 3 according to the third embodiment of the invention.
Figure 10B:
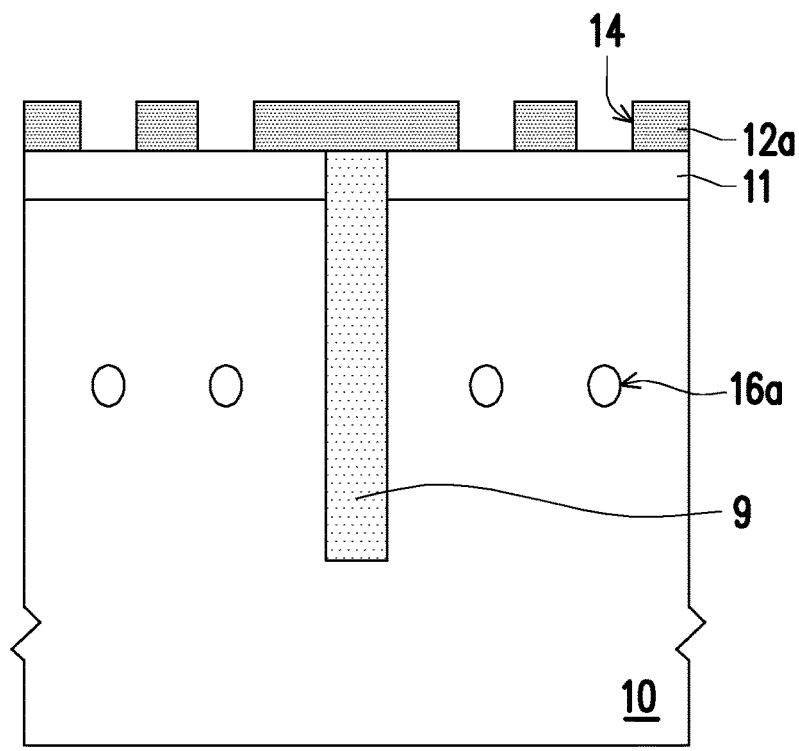
Figure 10C:
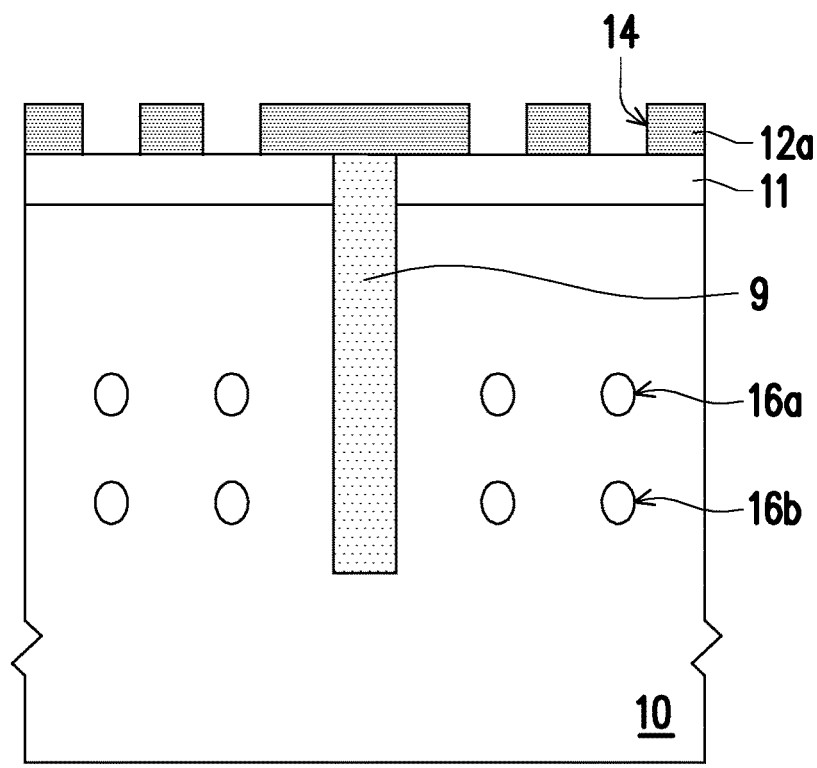
Figure 11C:
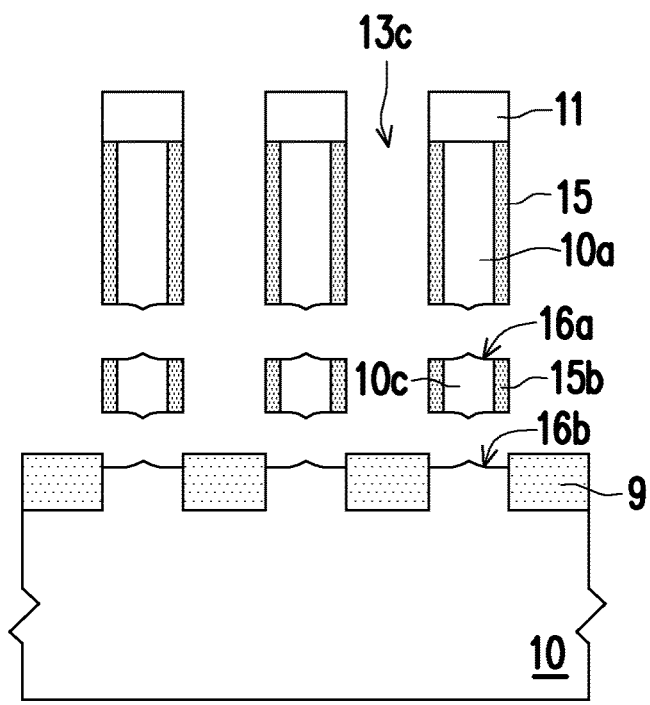
Figure 12C:
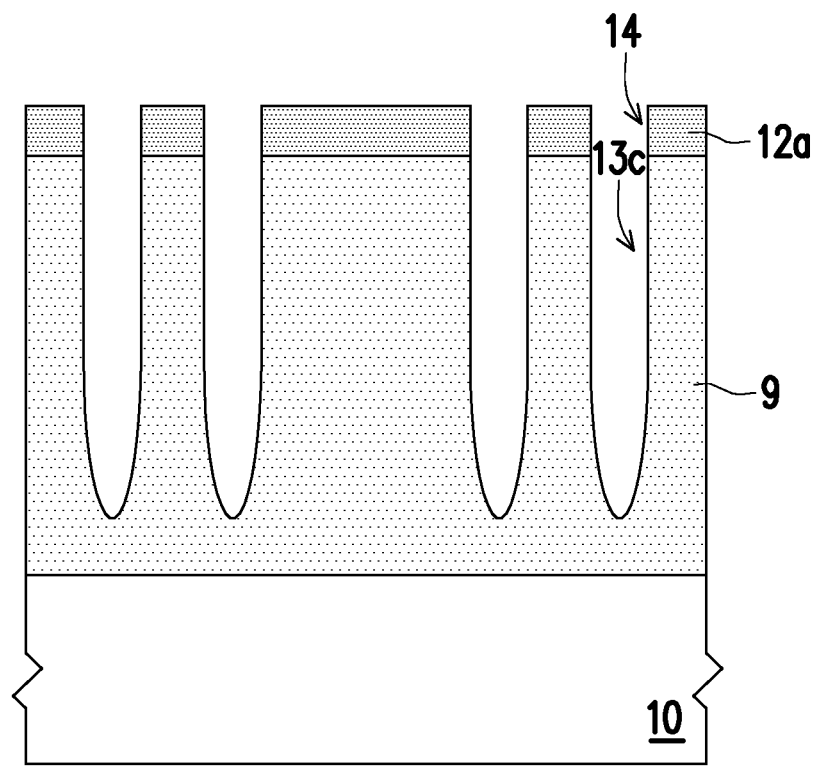

Referring to FIG. 10C to FIG. 12C, the first convex portion 10a and the third convex portion 10c are protected by the liners 15 and 15b and the fourth convex portion 10d is removed, so as to form the second word line tunnel 16b between the third convex portion 10c and the substrate 10. In some embodiments, columnar holes are extended from the second word line tunnel 16b along the first direction D1 and connected to the trench 13c. Referring to FIG. 10C, in some embodiments, the cross section of the second word line tunnel 16b at the A-A' line segment is oval, circular, rectangular, square, or a combination thereof. Referring to the cross section of the B-B' line segment of FIG. 11C, the second word line tunnel 16b is located between the third convex portion 10c and the substrate 10 to separate the third convex portion 10c and the substrate 10. The top surface of the second word line tunnel 16b is the bottom surface of the third convex portion 10c, and the bottom surface of the second word line tunnel 16b is the surface of the substrate 10. In some embodiments, the bottom surface of the second word line tunnel 16b and the surface of the isolation structure 9 are substantially level. However, the invention is not limited thereto. In some embodiments, the top surface and the bottom surface of the second word line tunnel 16b are flat surfaces. In some other embodiments, the top surface and the bottom surface of the second word line tunnel 16b are non-planar surfaces and are, for instance, v-shaped, r-shaped, γ-shaped, v-shaped, or a combination thereof. In some exemplary embodiments, the shape of the bottom surface of the second word line tunnel 16b is the mirror image of the top surface of the second word line tunnel 16b.

Figure 10D:
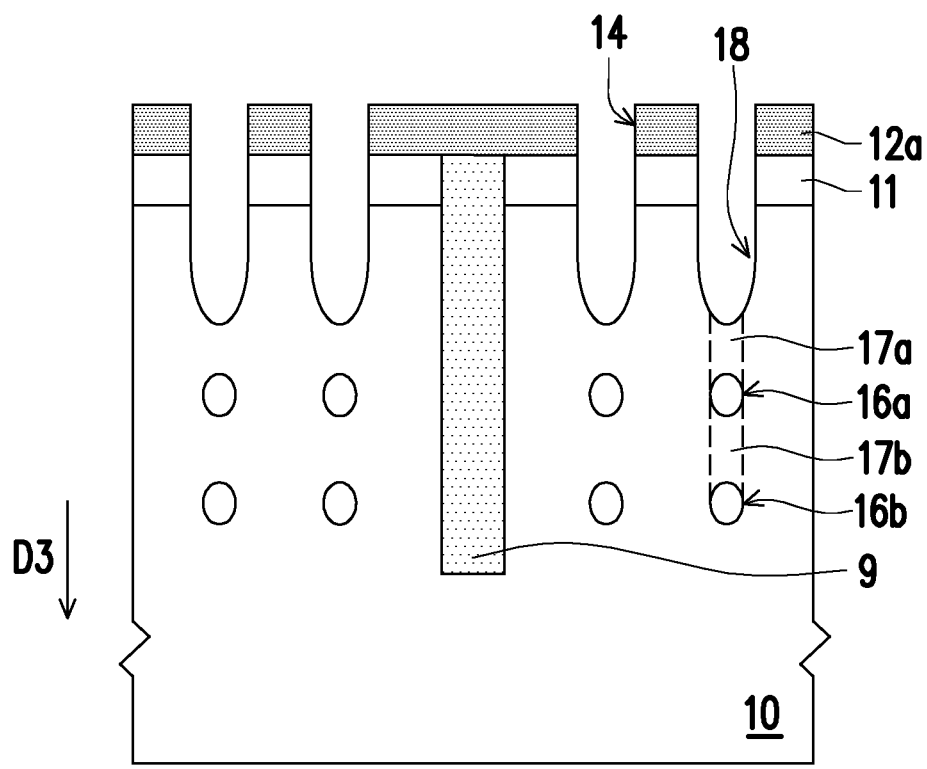
Figure 11D:
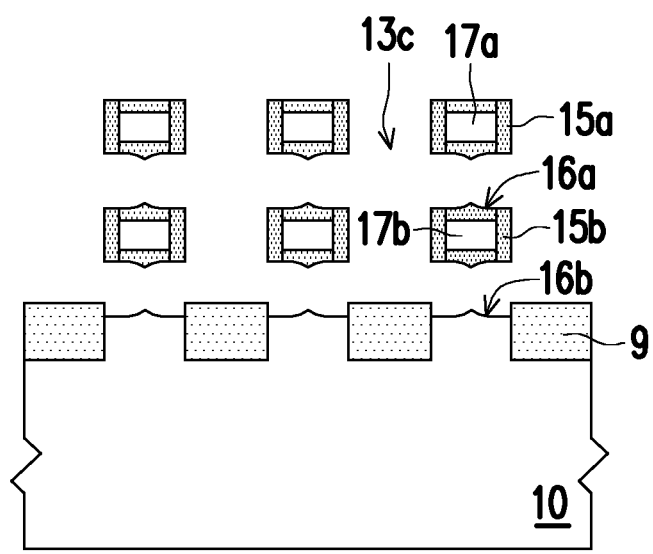
Figure 12D:
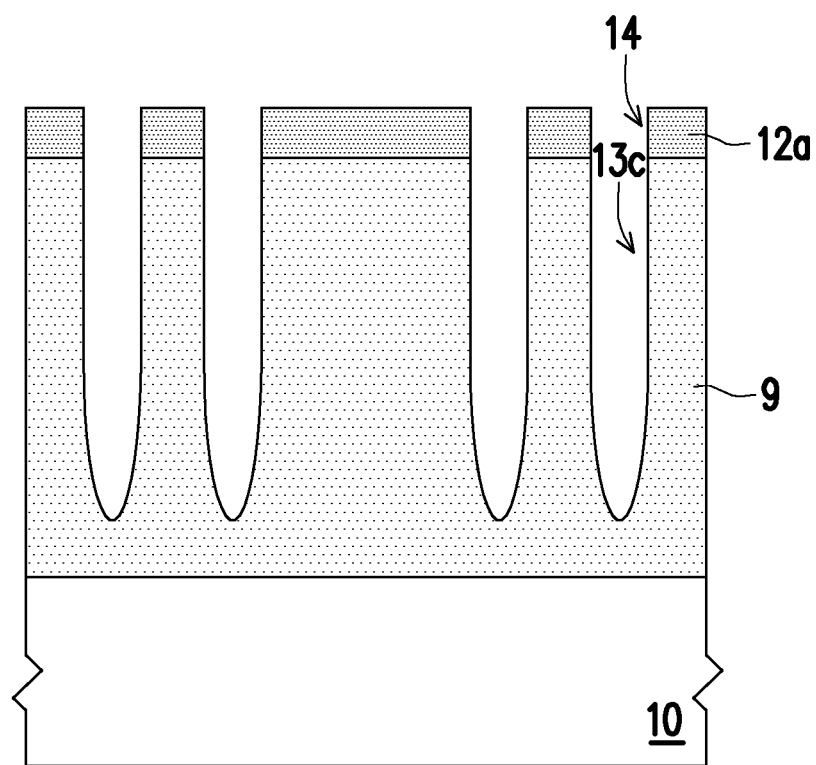

Referring to FIG. 10D to FIG. 12D, a portion of the first convex portion 10a is removed to form the gate trench 18 and first fin structures 17a. In other words, the first convex portion 10a after the removal is referred to as the first fin structure 17a. The third convex portion 10c is referred to as a second fin structure 17b and is located below the first fin structures 17a and arranged in a column along the first direction D1. In some embodiments, the second fin structures 17b are nanowire fin structures. Referring to FIG. 10D, the dynamic random access memory of the present embodiment includes the gate trench 18, the first fin structures 17a, the first word line tunnel 16a, the second fin structures 17b, the second word line tunnel 16b, and the substrate 10 from top to bottom in the active regions 8. The gate trench 18, the first word line tunnel 16a, and the second word line tunnel 16b are connected to the trench 13c.

Referring to FIG. 10E to FIG. 12E, a gate dielectric layer 19 is formed in the active regions 8 in the word line region 7. The gate dielectric layer 19 covers the sidewall and the bottom surface of the gate trench 18, the surface of the first word line tunnel 16a, the surface of the second word line tunnel 16b, and the mask layer 11. Referring to FIG. 11E, the upper and lower surfaces of the first fin structures 17a and the second fin structures 17b are both covered by the gate dielectric layer 19. The gate dielectric layer 19 on the upper and lower surfaces of the first fin structures 17a and the liner 15a form a first shielding structure 20a. The gate dielectric layer 19 on the upper and lower surfaces of the second fin structures 17b and the liner 15a form a second shielding structure 20b. The first fin structures 17a are surrounded and covered by the first shielding structure 20a. The second fin structures 17b are surrounded and covered by the second shielding structure 20b.

Figure 10E:
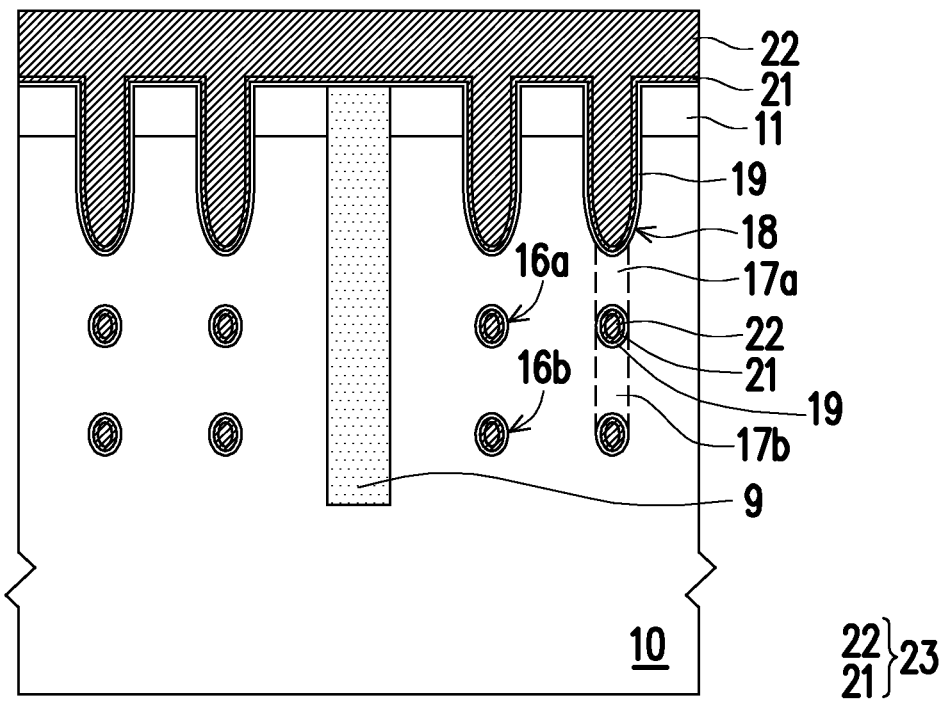
Figure 11E:
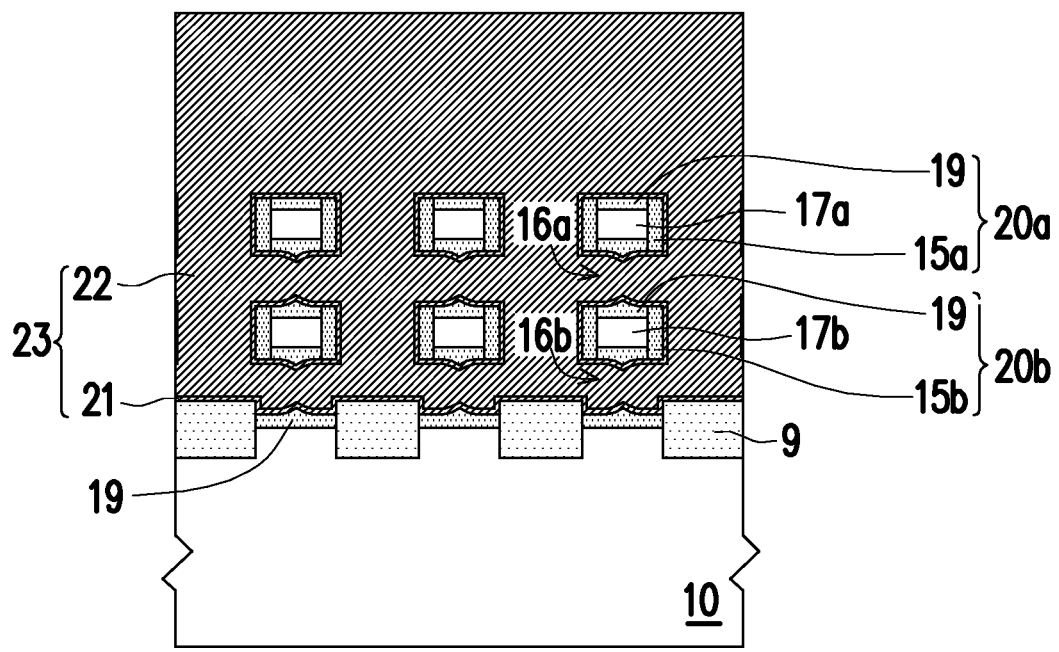
Figure 12E:
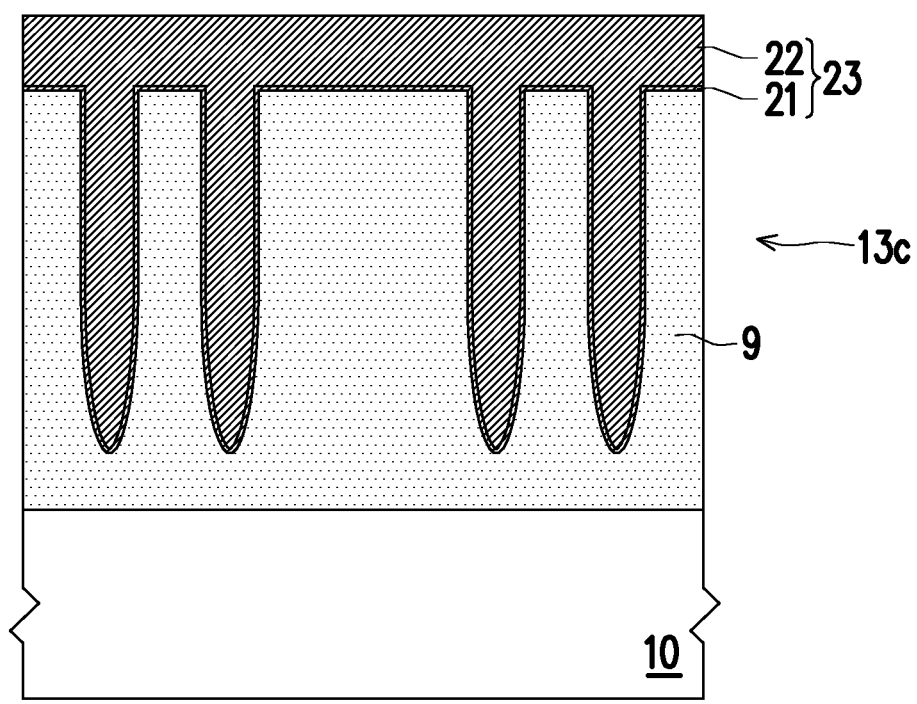

Referring to FIG. 10E to FIG. 12E and FIG. 10F to FIG. 12F, the conductive layer 23a and the dielectric layer 24 are formed on the substrate 10. The conductive layer 23a is filled in the trench 13c, the gate trench 18, the first word line tunnel 16a, and the second word line tunnel 16b and covers the isolation structure 9 and surrounds and covers the first fin structures 17a and the second fin structures 17b. In the gate trench 18, the conductive layer 23a covers the surface of the gate dielectric layer 19. In the first word line tunnel 16a and the second word line tunnel 16b, the conductive layer 23a is surrounded and covered by the gate dielectric layer 19 (FIG. 10E).

Figure 11F:
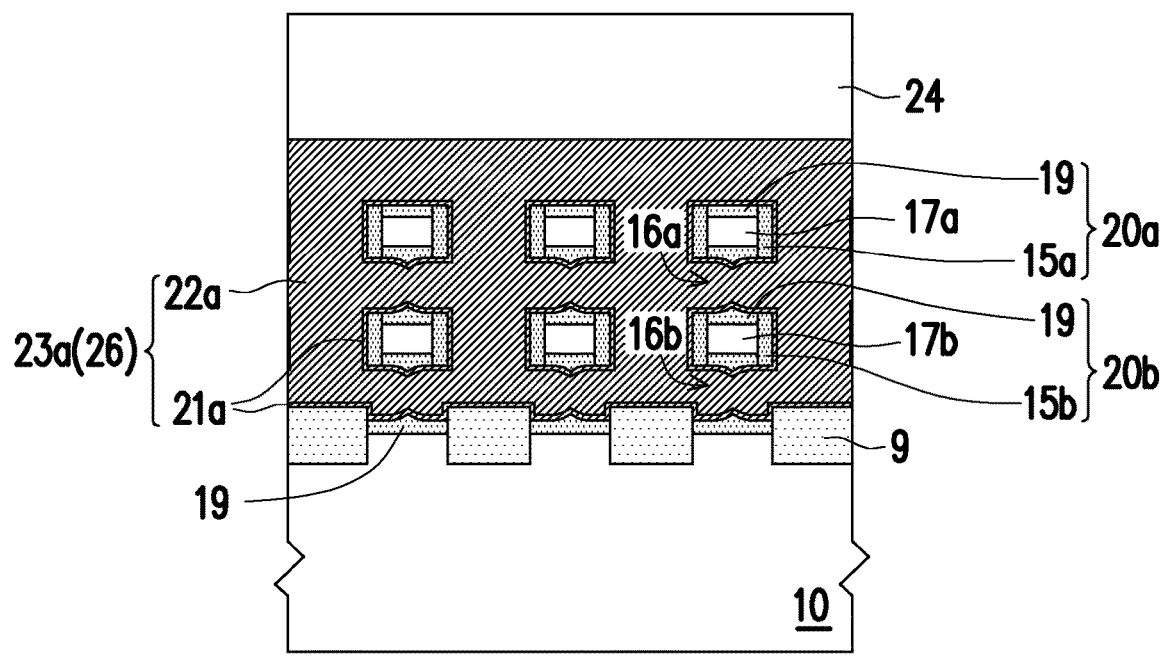
Figure 12F:
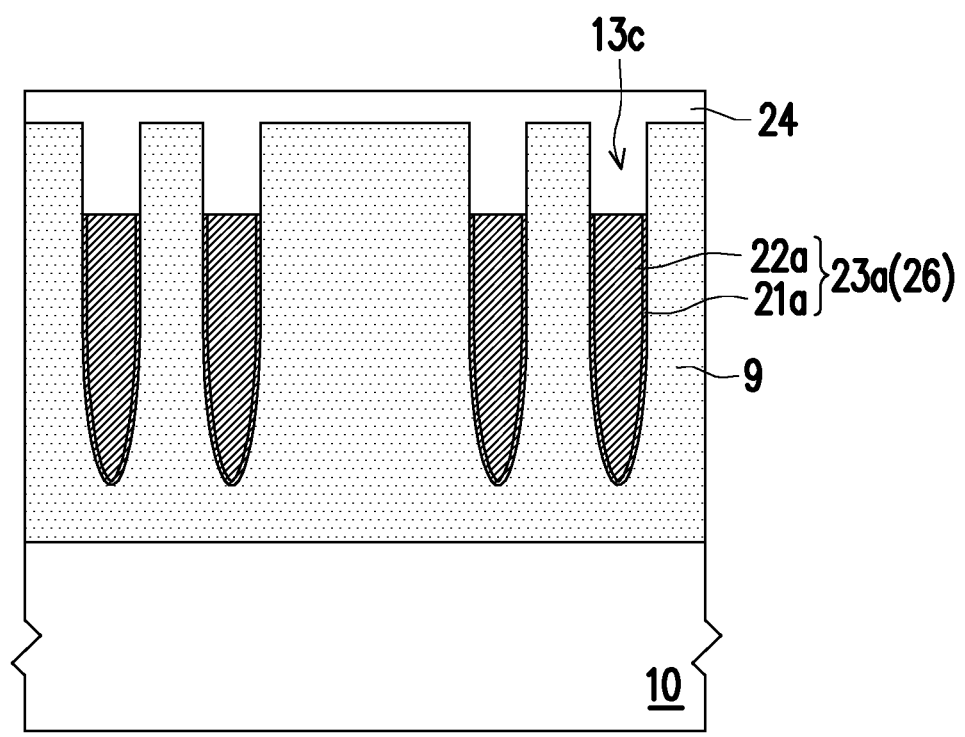
Figure 10G:
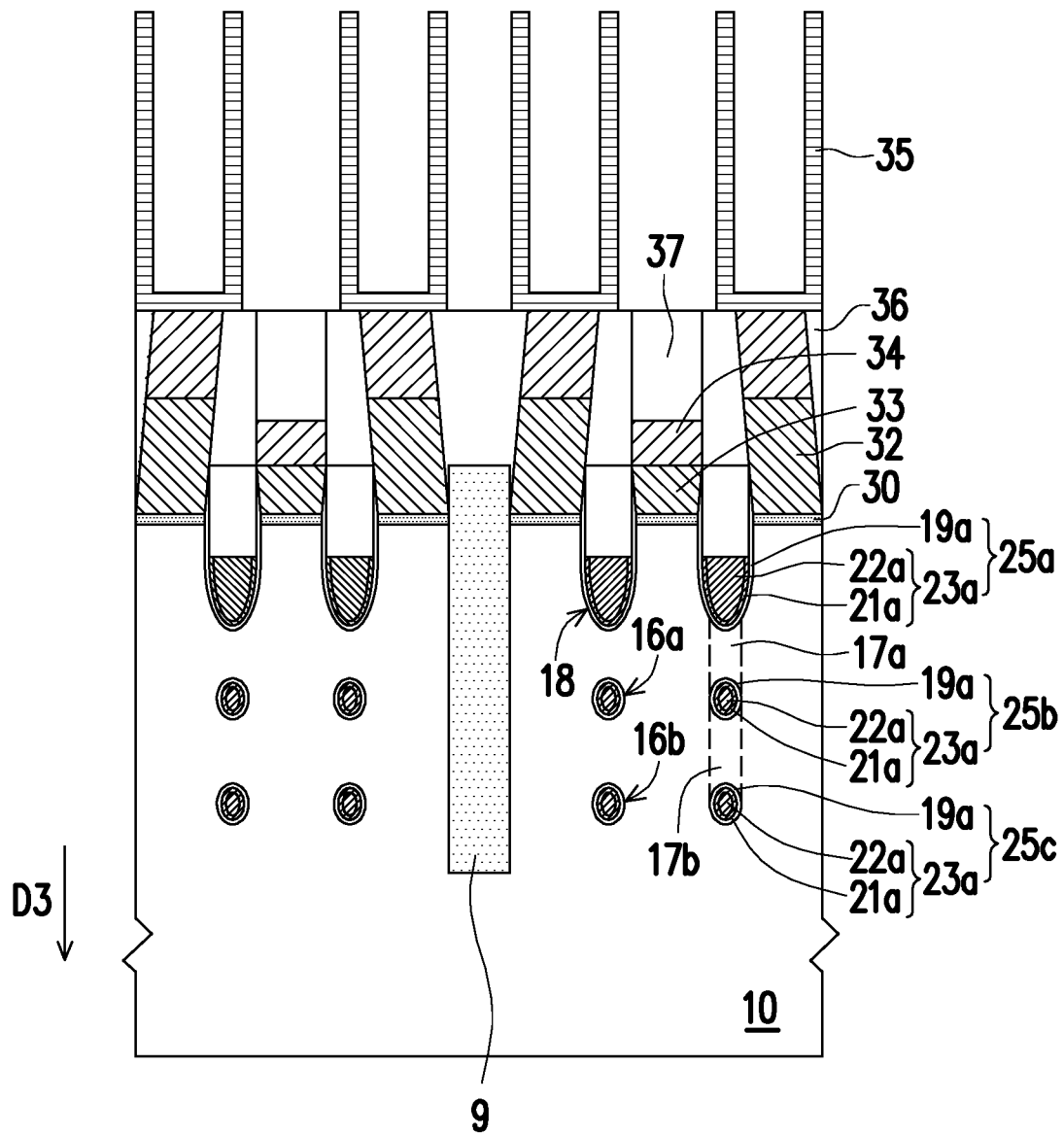
Figure 11G:
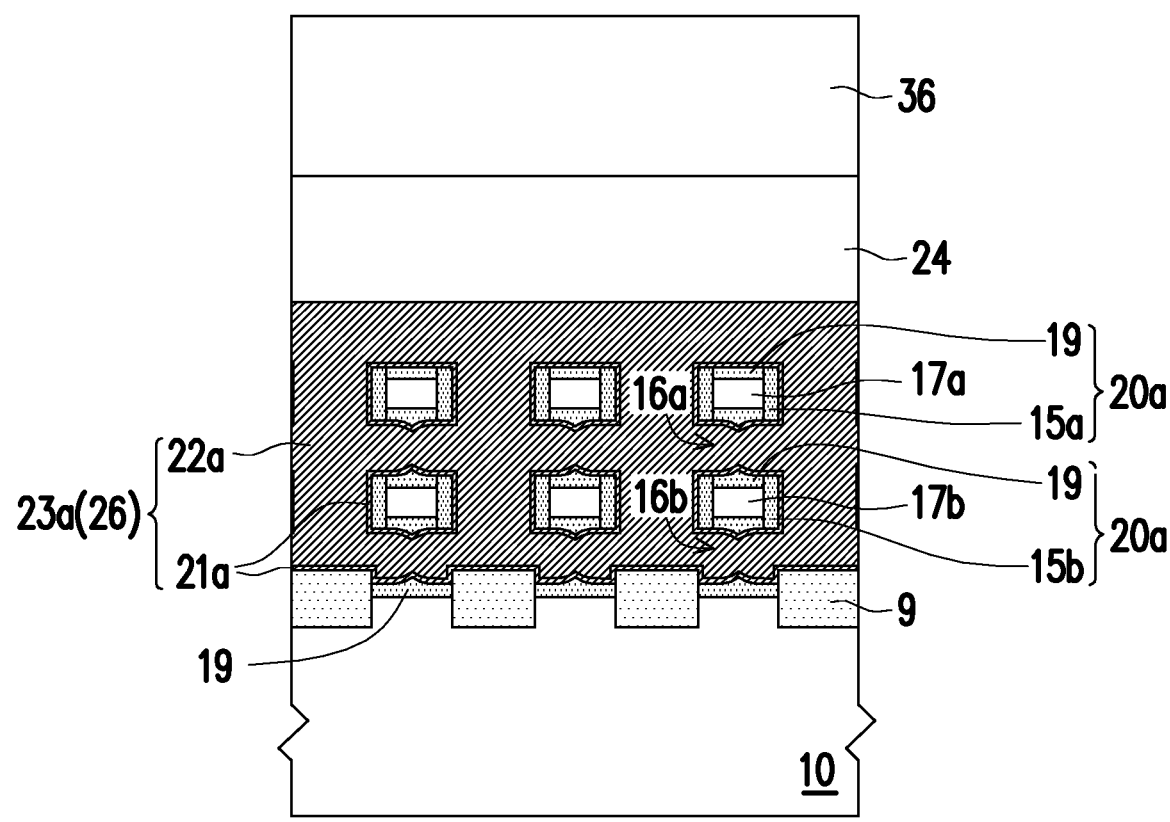
Figure 13:
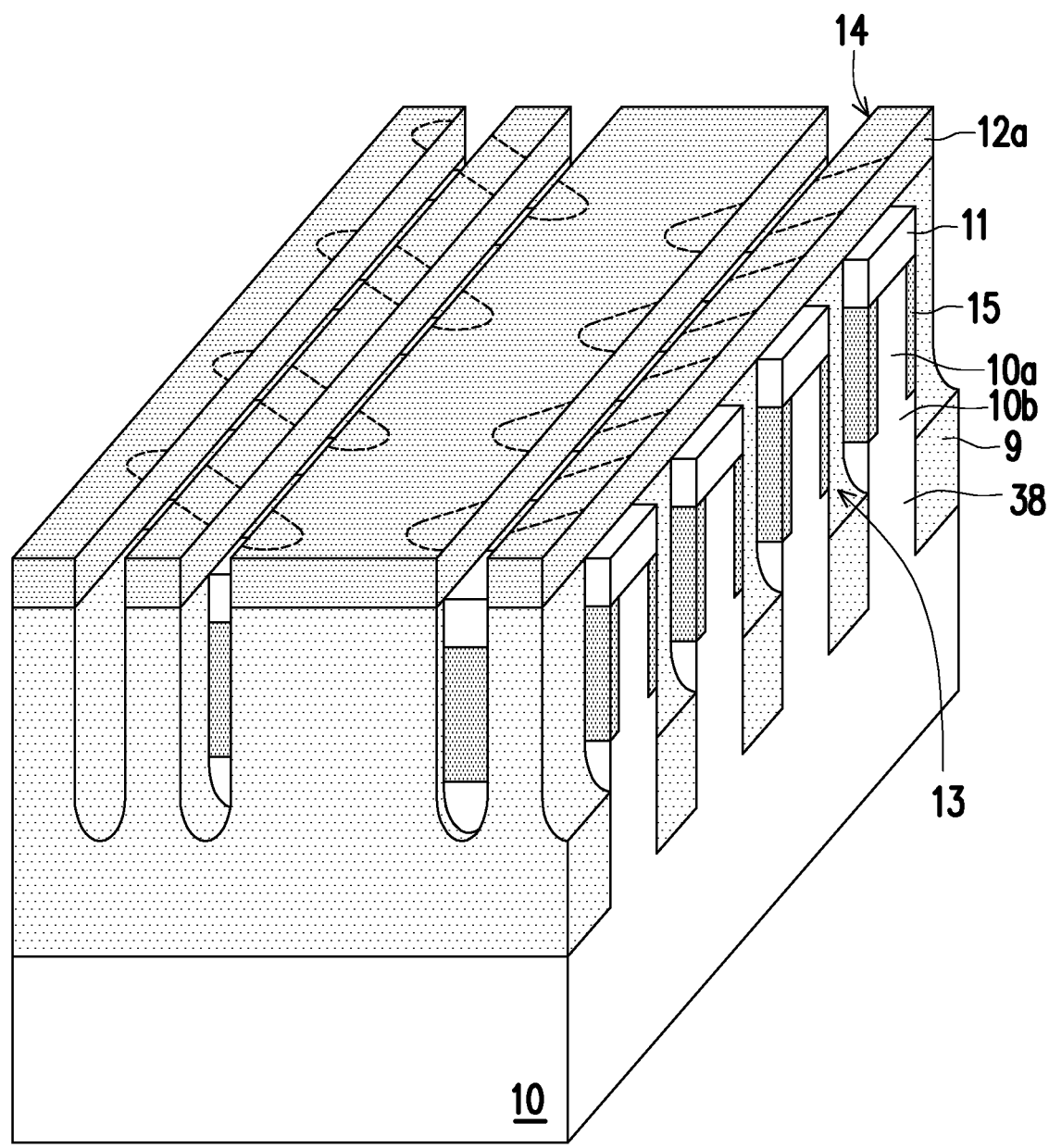
FIG. 13 to FIG. 15 are 3D diagrams of the dynamic random access memory according to the first embodiment of the invention.
Figure 17:
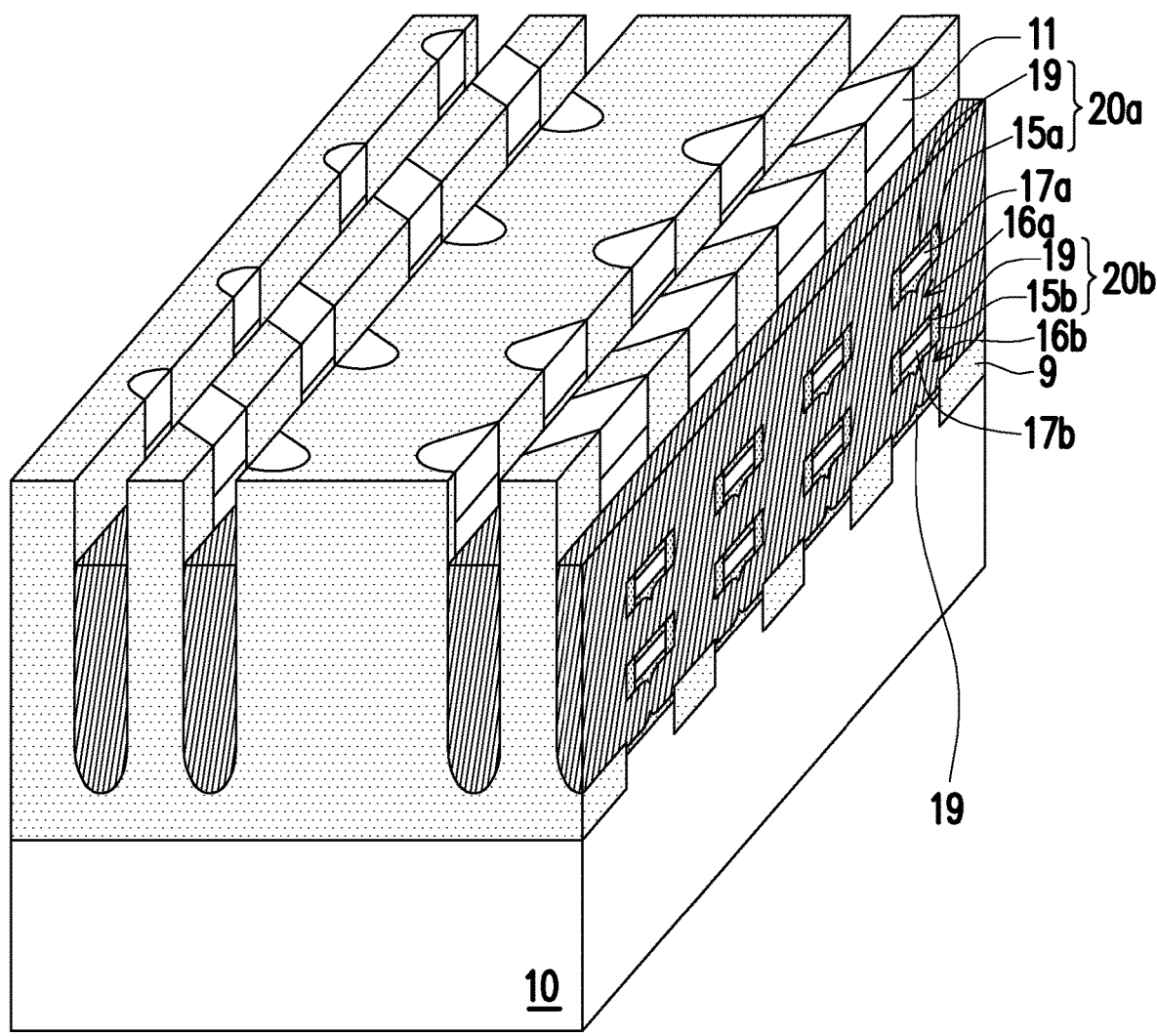
FIG. 17 is a 3D diagram of the dynamic random access memory according to the third embodiment of the invention.

In the present embodiment, the conductive layer 23a forms the buried word line structure 26. Referring to FIG. 17 and FIG. 11F, the buried word line structure 26 is extended along the first direction D1 and located in the trench 13c, the gate trench 18, the first word line tunnel 16a, and the second word line tunnel 16b and surrounds and covers the first fin structures 17a and the second fin structures 17b.

Figure 10F:
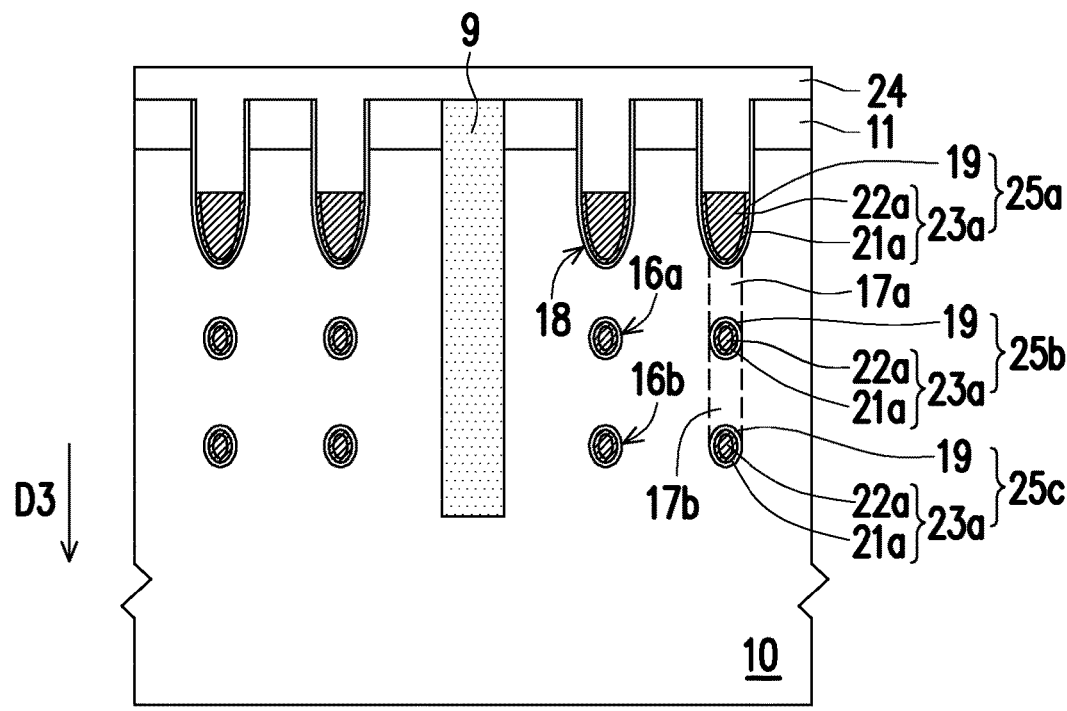

Referring to FIG. 10F, the conductive layer 23a and the gate dielectric layer 19 in the gate trench 18 form the first buried gate structure 25a. The conductive layer 23a and the gate dielectric layer 19 in the first word line tunnel 16a form the second buried gate structure 25b. The conductive layer 23a and the gate dielectric layer 19 in the second word line tunnel 16b form the third buried gate structure 25c. The first buried gate structure 25a is curved, semi-circular, or semi-elliptical. The second buried gate structure 25b and the third buried gate structure 25c are circular, oval, rectangular, square, or a combination thereof, and are surrounded and covered by the substrate 10. The first fin structures 17a are located between the first buried gate structure 25a and the second buried gate structure 25b. The second fin structures 17b are located between the second buried gate structure 25b and the third buried gate structure 25c. In other words, the dynamic random access memory of the present embodiment includes the dielectric layer 24, the first buried gate structure 25a, the first fin structures 17a, the second buried gate structure 25b, the second fin structures 17b, the third buried gate structure 25c, and the substrate 10 from top to bottom in the third direction D3 in the active regions 8 within the word line region 7.

Next, the source and drain regions 30, the dielectric layer 36, the bit line contact 33, the capacitor contact 32, the bit line 34, and the capacitor 35 can be formed according to the above method.

Referring to FIG. 3 and FIG. 10G to FIG. 11G, the difference between the present embodiment and the two embodiments above is that the dynamic random access memory of the present embodiment has three buried gate structures (25a, 25b, and 25c) and two fin structures (17a and 17b), such that device performance can be further improved.

Based on the above, in some embodiments of the invention, the dynamic random access memory has fin structures, and the fin structures are separated from the substrate by the buried word line structure. Since the fin structures are surrounded by the buried word line structure, the fin structures have better subthreshold slope, and therefore switching performance can be improved and the threshold value thereof can be reduced, such that refresh performance can be improved.

Moreover, in some embodiments of the invention, the gate trench has a buried gate structure, and one or a plurality of buried gate structures are surrounded and covered by one or a plurality of substrates, and therefore the performance of the dynamic random access memory can be improved and the channel resistance can be reduced, such that the performance of the dynamic random access memory in terms of write recovery time is improved. In some other embodiments of the invention, the fin structures and the substrate are separated by insulation structures such that the fin structures can produce lower depletion layer capacitance to effectively improve device performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A method of fabricating a dynamic random access memory, comprising:
    forming an isolation structure in a substrate, wherein the isolation structure defines a plurality of active regions arranged in a column along a first direction;
    forming a gate trench in the substrate;
    forming a buried word line structure partially filling in the gate trench, wherein the buried word line structure extends along the first direction and across the plurality of active regions and the isolation structure;
    forming a plurality of first fin structures in an intersecting region of the active regions and the buried word line structure, wherein the plurality of first fin structures are arranged in a column along the first direction and surrounded and covered by the buried word line structure; and
    forming a dielectric layer disposed on the substrate, filling the gate trench and covering the buried word line structure.

2. The method of claim 1, wherein the forming the buried word line structure comprises forming a conductive layer, and the plurality of first fin structures is surrounded and covered by the conductive layer.

3. The method of claim 2, wherein the forming the buried word line structure further comprises forming a plurality of insulation structures located between the plurality of first fin structures and the substrate.

4. The method of claim 3, wherein the conductive layer of the buried word line structure covers a surface and a sidewall of the plurality of first fin structures and a sidewall of the plurality of insulation structures.

5. The method of claim 1, further comprising a plurality of second fin structures located below the plurality of first fin structures, wherein the plurality of first fin structures and the plurality of second fin structures are both located in the buried word line structure and surrounded and covered by the buried word line structure.

6. The method of claim 1, wherein the dielectric has a portion formed in the substrate.

7. A method of fabricating a dynamic random access memory, comprising:
forming a first word line tunnel in a substrate;
forming a first buried gate structure in the substrate above and separated from the first word line tunnel, wherein a sidewall and a bottom surface of the first buried gate structure are covered by the substrate, and a top surface of the first buried gate structure is covered by a dielectric layer; and
forming a dielectric material layer at least covering a surface of the first word line tunnel.

8. The method of claim 7, further comprising forming a conductive layer in the first word line tunnel, wherein the dielectric material layer is a gate dielectric layer and forms a second buried gate structure with the conductive layer.

9. The method of claim 7, wherein the dielectric material layer is completely filled in the first word line tunnel as an insulation structure.

10. The method of claim 8, further comprising forming a second word line tunnel below the first word line tunnel in the substrate, and the second word line tunnel and the first word line tunnel are not connected to each other.

11. The method of claim 10, further comprising forming a third buried gate structure in the second word line tunnel and surrounded and covered by the substrate, wherein in the substrate, the first buried gate structure, the second buried gate structure, and the third buried gate structure are arranged from top to bottom.

12. A method of fabricating a dynamic random access memory, comprising:
providing a substrate;
removing a portion of the substrate such that the substrate comprises a convex portion and a concave portion;
protecting a first convex portion of the convex portion and removing a second convex portion below the first convex portion to form a first word line tunnel in the substrate;
removing a portion of the first convex portion to form a gate trench and a first fin structure; and
forming a first buried gate structure in the gate trench, wherein forming the first buried gate structure comprises forming a gate dielectric layer and a conductive layer.

13. The method of claim 12, further comprising forming a second buried gate structure in the first word line tunnel when the first buried gate structure is formed.

14. The method of claim 12, further comprising, before the first buried gate structure is formed, forming an insulation structure in the first word line tunnel.

15. The method of claim 13, further comprising, after the first word line tunnel is formed and before the portion of the first convex portion is removed, protecting a third convex portion of the convex portion and removing a fourth convex portion of the convex portion below the third convex portion to form a second word line tunnel and a second fin structure in the substrate.

16. The method of claim 15, further comprising forming a third buried gate structure in the second word line tunnel when the first buried gate structure and the second buried gate structure are formed, wherein forming the third buried gate structure comprises forming a gate dielectric layer and a conductive layer.

17. The method of claim 15, wherein protecting the third convex portion comprises forming a liner on a sidewall of the third convex portion.

18. The method of claim 12, wherein protecting the first convex portion comprises forming a liner on a sidewall of the first convex portion.

19. The method of claim 12, further comprising:
forming an isolation structure on the concave portion before the first word line tunnel is formed;
forming a first trench in the isolation structure to expose the first convex portion of the convex portion; and
removing the isolation structure below the first trench to form a second trench, wherein the second trench exposes the second convex portion.

20. The method of claim 19, wherein a depth of the second trench is different from a depth of the gate trench.

* * * * *